United States Patent
Cheng et al.

(10) Patent No.: US 8,669,834 B2
(45) Date of Patent: Mar. 11, 2014

(54) SUBSTRATE INTEGRATED WAVEGUIDE

(76) Inventors: Shi Cheng, Uppsala (SE); Karl Henrik Kratz, Knivsta (SE); Hanna Ali Yousef, Uppsala (SE)

( * ) Notice: Subject to any disclaimer, the term of this patent is extended or adjusted under 35 U.S.C. 154(b) by 551 days.

(21) Appl. No.: 12/922,588

(22) PCT Filed: Mar. 17, 2009

(86) PCT No.: PCT/SE2009/050271
§ 371 (c)(1),
(2), (4) Date: Sep. 14, 2010

(87) PCT Pub. No.: WO2009/116934
PCT Pub. Date: Sep. 24, 2009

(65) Prior Publication Data
US 2011/0018657 A1    Jan. 27, 2011

Related U.S. Application Data

(60) Provisional application No. 61/037,553, filed on Mar. 18, 2008.

(51) Int. Cl.
*H01P 3/16*    (2006.01)
*H01P 11/00*    (2006.01)
*H01Q 13/22*    (2006.01)

(52) U.S. Cl.
USPC ............. 333/239; 29/600; 343/771; 343/772; 333/248

(58) Field of Classification Search
USPC ............. 333/239, 208, 248; 29/600; 343/771, 343/772
See application file for complete search history.

(56) References Cited

U.S. PATENT DOCUMENTS 5,982,256 A * 11/1999 Uchimura et al. ............ 333/239
2007/0120628 A1    5/2007 Jun et al.
2008/0012663 A1    1/2008 Chung et al.

FOREIGN PATENT DOCUMENTS

JP    2005-102024 A    4/2005

OTHER PUBLICATIONS

Lindeberg et al, A Comprehensive Study of Ion Track Enabled High Aspect Ratio Microstructures in Flexible Circuit Boards, Microsystem Technologies 10, 2004, p. 608-621.

* cited by examiner

*Primary Examiner* — Benny Lee
*Assistant Examiner* — Rakesh Patel
(74) *Attorney, Agent, or Firm* — Porter Wright Morris & Arthur LLP

(57) ABSTRACT

A substrate integrated waveguide (10) comprises a top conductive layer (14) and a bottom conductive layer (15) provided on either sides a substrate (11). At least one wall (12, 13) of conductive material is provided in the substrate (11) to define, together with the top and bottom layers (14, 15), the waveguide. The at least one wall (12, 13) comprise a multitude of thin conductive wires densely arranged close to each other in the substrate (11) and having respective short ends connected to the top and bottom layers (14, 15). The high number of wires per surface unit in the wall (12, 13) effectively prevent significant amount of power leakage through the wall (12, 13) during operation of the substrate integrated waveguide (10).

23 Claims, 28 Drawing Sheets

*Top View*
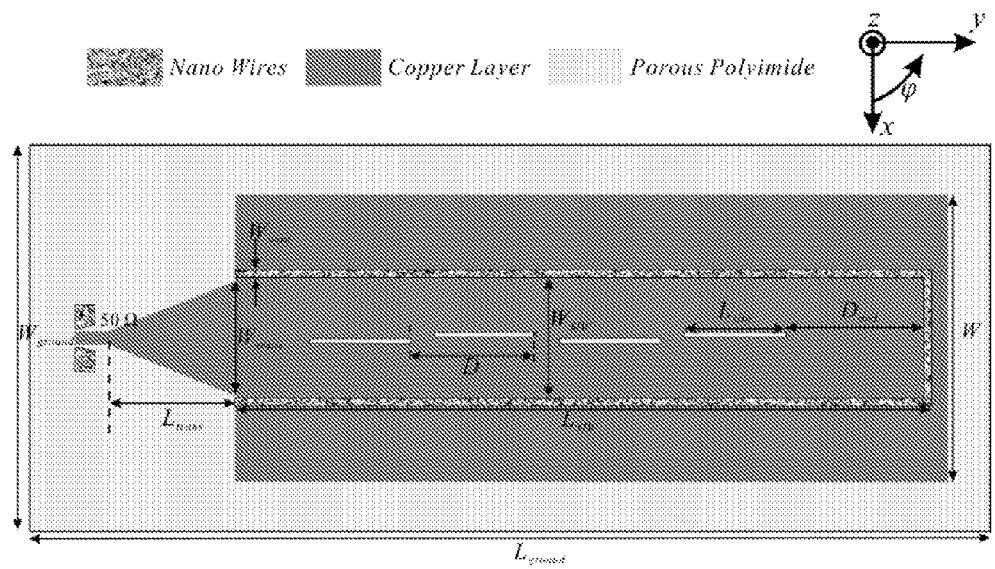
*Side View*
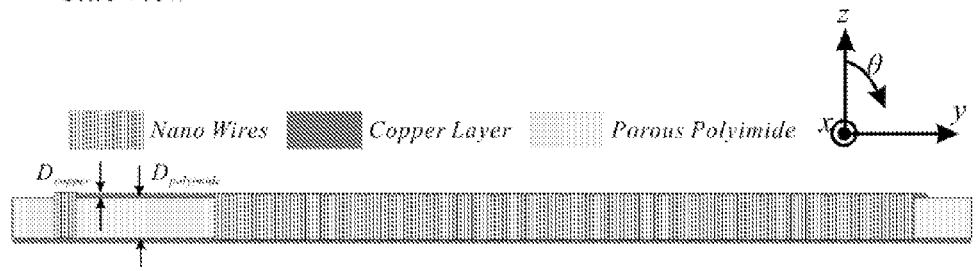
Fig. 17

US 8,669,834 B2

SUBSTRATE INTEGRATED WAVEGUIDE

RELATED APPLICATIONS

The present application is a 371 of PCT/SE2009/050271 filed Mar. 17, 2009, and claims priority under 35 U.S.C. 119 of U.S. Application Ser. No. 61/037,553 filed Mar. 18, 2008.

TECHNICAL FIELD

The present invention generally relates to waveguides and in particular to substrate integrated waveguides.

BACKGROUND

Communication, sensing, and imaging devices today are moving towards higher operation frequencies and broader bandwidths to enable higher communication speeds. A consequence of higher operation frequencies is that the size of the components in the devices must be decreased. This is an important driving force for miniaturization of devices and the components that constitute them. Further advantages of miniaturization are that the devices can become lighter and cheaper, with lower power consumption and with a larger number of functions integrated into the same volume.

Waveguides are used to transmit electromagnetic wave signals from one position to another. When using waveguides, it is desirable to transmit the full guided power from one point to another, with no or only minor effect losses. To achieve this, waveguides are often closed, having a pipe-like construction. If the pipe-like waveguides are hollow with metallic walls, the wave is efficiently confined. However, such structures are rigid, which is not always desirable. Furthermore, metallic hollow structures at very high frequencies are difficult to fabricate as miniaturized waveguides where high precision 3D manufacturing process is required. Hence, alternative types of micromachined waveguides have been developed to overcome these restrictions [1]. However, all of these structures necessitate costly manufacturing techniques.

A new concept for waveguides called substrate integrated waveguides (SIWs) has therefore been introduced [2-4]. SIWs can be seen as rectangular pipe-like waveguides that are incorporated into the substrate itself. They generally consist of two vertical walls, a top and a bottom layer, with a dielectric material, i.e. the substrate itself, in between. In this way, SIWs can also be seen as pipe-like, but with the additional merits of miniaturization, low cost and ease of integration with other components on the same substrate. Several SIWs have been demonstrated for use in a number of different components for devices at frequencies ranging from around 10 GHz to 180 GHz [5-8]. Demonstrated SIWs that can operate at frequencies above the $K_a$-band (26.5-40 GHz, often denoted microwave band) are fabricated using relatively costly fabrication techniques and materials.

SIWs are traditionally manufactured using rigid printed circuit board (PCB) fabrication techniques to reduce fabrication costs. In this case, the vertical walls of the SIWs are not continuous metallic walls, but rather rows of metallized through-hole vias or posts, see FIG. 5A. The size and spacing of these metallized vias are in the order of several hundred micrometers. The through-holes in the circuit board are formed by mechanical drilling or by laser techniques. The prior art technique results in significant gaps between the vias of several hundred micrometers, causing some of the guided power to radiate out of the waveguide and is therefore lost. Correspondingly, power from adjacent power radiating structures, such as nearby antennas, can radiate into the waveguide through the gaps, thereby contributing to noise and interference.

A PCB SIW with metallized vias having a diameter of 0.3 mm and a vias spacing of 0.6 mm has been fabricated [16].

The leakage loss is frequency dependent, and the higher the frequency the higher the losses. Consequently, SIWs fabricated by printed circuit board fabrication techniques and having large vias diameters and spacings cannot operate at high frequencies. Previously presented SIWs fabricated with printed circuit board fabrication techniques have been demonstrated at frequencies up to $K_a$-band [9-10].

SUMMARY

There is, thus, a need for a substrate integrated waveguide that can be used at high frequencies, such as in and above $K_a$-band, but still only has acceptable losses and can be produced at a reasonable cost.

It is a general objective to provide a substrate integrated waveguide achieving at least acceptable losses at the desired operating frequencies.

This and other objectives are met by embodiments as defined by the accompanying patent claims.

Briefly, the embodiments relate to a substrate integrated waveguide having a top conductive layer and a bottom conductive layer provided on either sides of a substrate, preferably a dielectric substrate. At least one wall of conductive material traverses the substrate thickness and electrically connects the top and bottom layers. This at least one wall comprises a multitude of densely packed thin conductive wires extending through the substrate to have respective first short ends connected to the top layer and respective second, opposite short ends connected to the bottom layer. The wires are so densely packed in the wall or walls to achieve a density of at least $10^4$ wires/cm$^2$. This high wire density prevents any significant power leakage through the at least one wall during operation of the substrate integrated waveguide.

A method for producing such a substrate integrated waveguide involves irradiating at least a selected portion of the substrate with accelerated particles to form a multitude of tracks of damaged substrate material in the substrate. Damaged substrate material is removed from at least a selected portion of the substrate, preferably by etching, to form a multitude of capillaries through the substrate along the tracks. At least a portion of these capillaries is then filled with a conductive material to form a multitude of conductive wires traversing the substrate. These conductive wires are arranged in the substrate to define the at least one wall of the substrate integrated waveguide. The respective short ends of the conductive layers are also electrically connected to a top conductive layer provided on a first surface of the substrate and to a bottom conductive layer provided on a second, opposite surface of the substrate.

BRIEF DESCRIPTION OF THE DRAWINGS

The invention, together with further objects and advantages thereof, may best be understood by making reference to the following description taken together with the accompanying drawings, in which:

FIG. 17 is a schematic illustration of a SIW-based longitudinal slot array antenna;

DETAILED DESCRIPTION

Throughout the drawings, the same reference numbers are used for similar or corresponding elements.

The present embodiments generally relate to a substrate integrated waveguide (SIW) and a method of producing such a SIW. The SIW has advantageous properties in that it allows operation at high frequencies by being able to be efficiently manufactured at small sizes and still achieve lower power losses than the prior art PCB-based SIWs.

SIWs are sometimes referred to as laminated waveguides or post waveguides in the art. The expression "substrate integrated waveguide" will be used throughout the present description but also encompasses laminated waveguides, post waveguides and other synonymous expressions used in the art for representing this type of waveguides.

Figure 1:
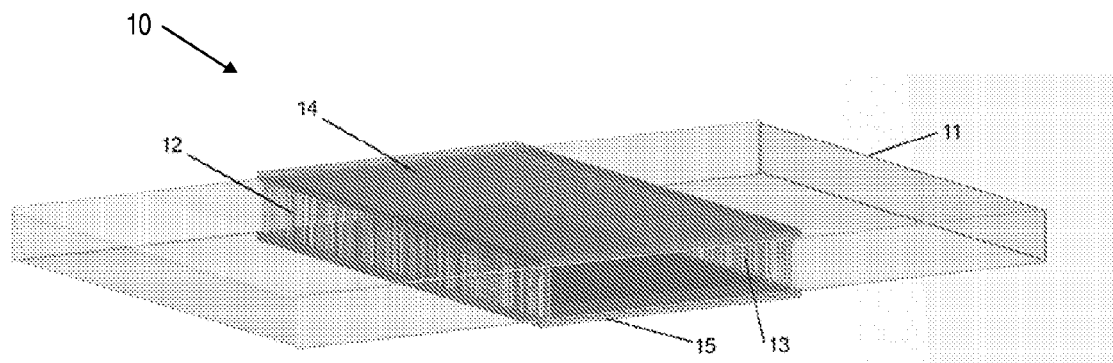
FIG. 1 is a schematic embodiment of a substrate integrated waveguide (SIW) of the present invention.

FIG. 1 discloses an embodiment of a SIW 10 having a first wall 12, preferably substantially vertical wall 12, a second wall 13, preferably a substantially vertical wall 13, a top layer 14 and a bottom layer 15. The substrate integrated waveguide 10 is incorporated in the substrate 11 in the figure. The distance between the two, preferably vertical, walls 12 and 13 is dependent on the SIW operation frequency, which is well known in the art. The length of the SIW 10 can be selected and adapted based on the particular application of the SIW 10. Non-limiting examples of suitable waveguide lengths can be a few hundred micrometers to tens of millimeters, in most practical applications. The height of the walls 12, 13 corresponds to the thickness of the substrate 11 and is therefore dependant on the particular substrate structure used. The SIW 10 of the embodiments can be beneficially used in applications with operation frequencies in the microwave frequency range up to and including the terahertz range. The walls 12, 13 are preferably vertical and more preferably substantially parallel walls 12, 13 as traditionally used in waveguides.

In more detail, still referring to the embodiment of FIG. 1, the substrate 11 is a generally thin film substrate 11 typically having a thickness thinner than, in most cases, around 600 µm, preferably thinner than around 500 µm, although thicker substrate structures are technically possible. The thin film substrate 11 comprises an electrically insulating material, i.e. a dielectric material, with or without conductive layers on the top and or bottom surfaces. The utilization of such a thin film substrate 11 enables the production of flexible printed circuit boards. Typical thin film substrate materials that are suitable for use in the present invention are commercially available flexible printed circuit board materials such as polyimide foils, polyethylene naphthalate (PEN) foils, polyethylene foils, polyethylene terephthalate (PET) foils, and liquid crystal polymer (LCP) foils. Further substrate materials include polytetrafluoroethylene (PTFE) and other fluorinated polymers, such as perfluoroalkoxy (PFA) and fluorinated ethylene propylene (FEP), Cytop® (amorphous fluorocarbon polymer), and HyRelex materials available from Taconic.

For SIW operation frequencies around 100 GHz and higher, liquid crystal polymers may prove to be the most beneficial due to low dielectric losses. At lower frequencies, the other mentioned substrate materials can be sufficient.

The particular substrate material used can be selected based on parameters, such as acceptable dielectric losses, operation frequencies of the SIW and desired mechanical properties of the substrate 11, such as being flexible and bendable.

Figure 20:
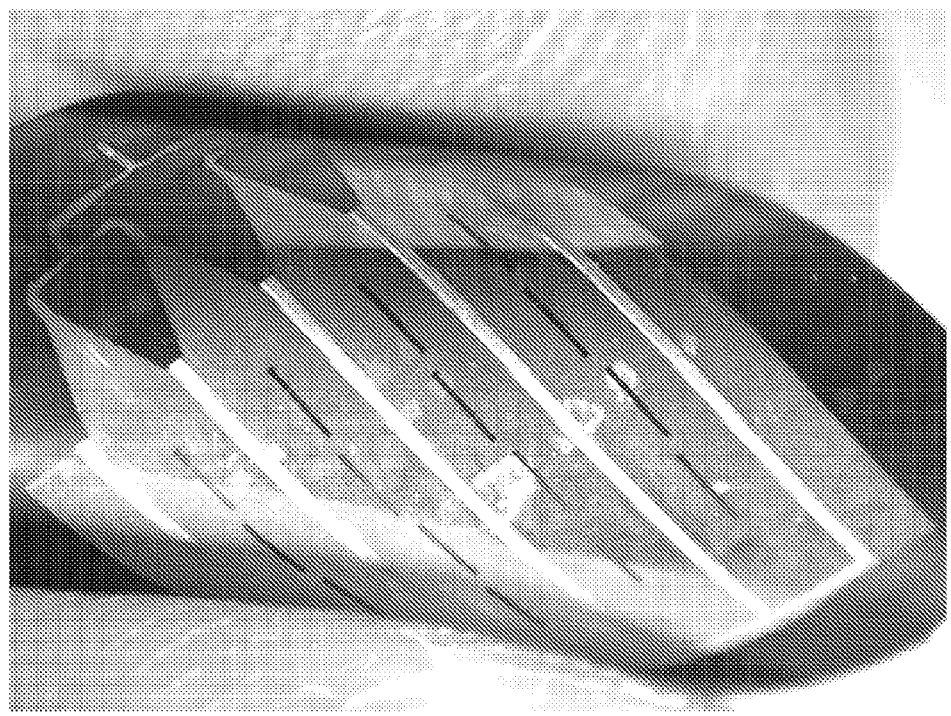
FIG. 20 is a photograph of a folded four-by-four slot array antenna based on SIW.

One of the benefits of using a flexible substrate material in the SIW is the ability to bend it on other surfaces, see FIG. 20. This is usually denoted conformal antennas or conformal microwave substrates in the art. The SIW of the invention can therefore advantageously be used in application requiring such bended or conformable structures, e.g. a conformal SIW-based antenna arranged in the bumper on a car or other motor vehicle. The manufacturing process of the SIW, in particular the pattern of capillaries through the substrate and the organization of the wires in the SIW walls can be selected to achieve maximum performance in the conformal state.

As was previously mentioned, the thin film substrate is either bare or clad with a conductive layer, preferably a conductive metal, such as copper, gold or silver, with or without adhesion layers, such as chromium and titanium. The top and/or bottom conductive layer 14, 15 can be a single layer structure or a multi-layer or sandwich structures. In the latter case, one and a same conductive material or different conductive materials can be used in the different conductive layers.

In order to further reduce the dielectric losses, the SIW 10 can be made free-standing by removing the substrate material itself after fabrication of the substrate integrated waveguide 10. In such a case, the portion of the thin film substrate 11 present inside the SIW 10 can be removed. In addition, or alternatively the portion of the thin film substrate 11 present outside of the SIW 10 and the beyond the vertical walls 12, 13 can likewise be removed, though having less impact on the dielectric losses. Removal or dissolving of the selected portions of the substrate material can be effected using various techniques known in the art, depending on the particular substrate material. Non-limiting examples include wet etching, anisotropic wet etching, plasma etching, dry etching, dissolution in solvents, ultrasound, etc.

However, the removal or dissolution of the substrate material preferably does not remove or at least not substantially remove the substrate material from the walls 12, 13 of the SIW 10. The presence of the substrate material in the walls 12, 13 is thought to further improve the mechanical stability of the SIW 10 and is therefore preferably kept even though other parts of the substrate 11 may be removed.

Figure 34A:
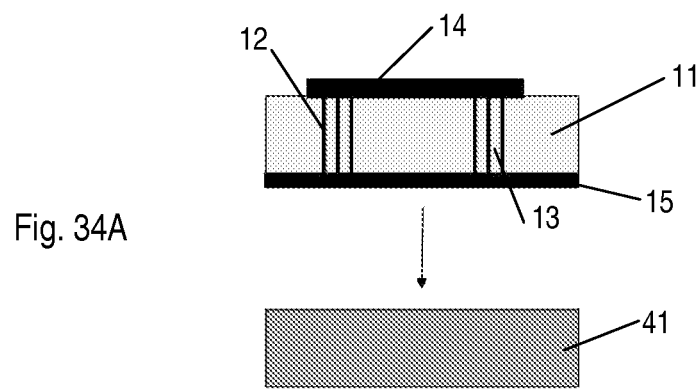
FIGS. 34A to 34C schematically illustrate removal of substrate material for the SIW.
Figure 34B:
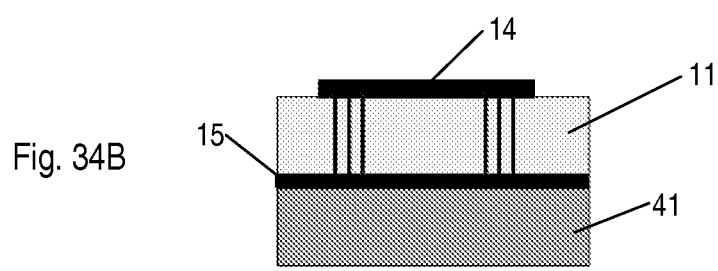
Figure 34C:
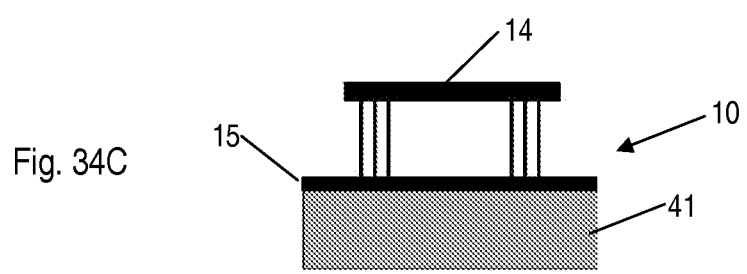
Figure 35:
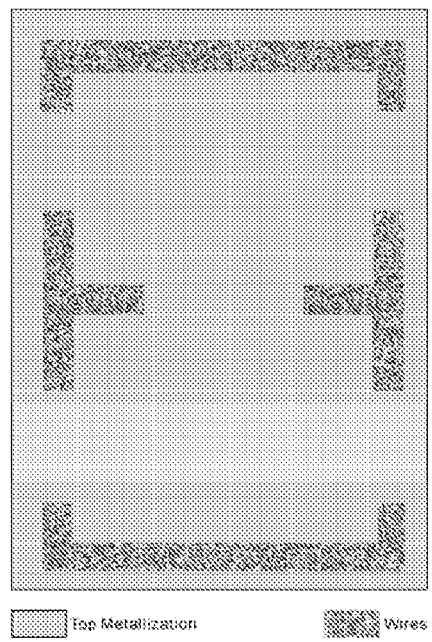
FIG. 35 is an embodiment of a SIW-based coupler.
Figure 36:
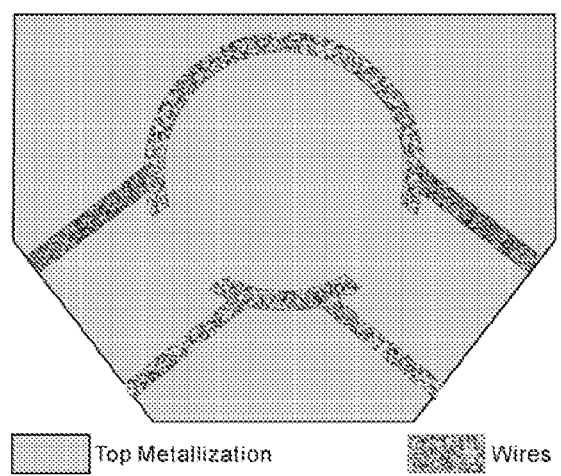
FIG. 36 is an embodiment of a SIW-based filter.
Figure 37:
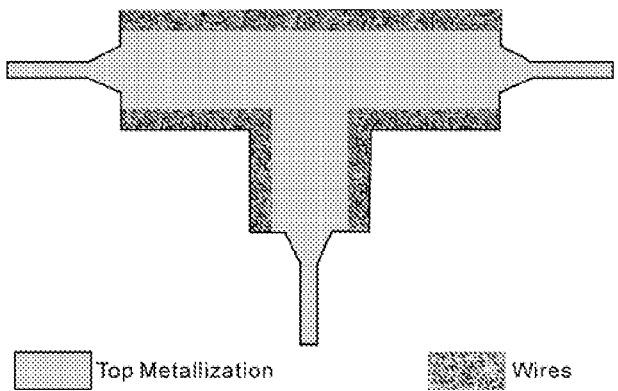
FIG. 37 is an embodiment of a SIW-based power divider.
Figure 38:
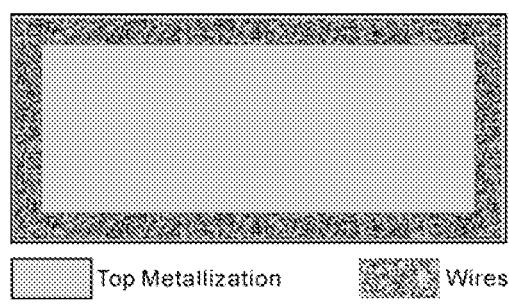
FIG. 38 is an embodiment of a SIW-based resonator.
Figure 39:
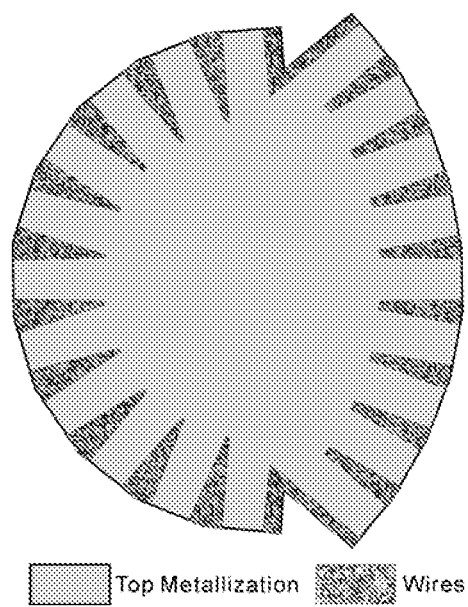
FIG. 39 is an embodiment of a SIW-based Rotman lens.

FIGS. 34A to 34C illustrate a process of producing an alternative embodiment of a SIW 10. First, the SIW 10 having the original substrate material 11 is bonded to another substrate material 41. This bonding is preferably performed between the conductive bottom layer 15 of the SIW 10 and the other substrate material 41, which may for instance be a chip or circuitry comprising electrical connections. The bonding can be affected through any known technique available in the art, such as laminating, gluing, thermal bonding, eutectic bonding, intermediate layer bonding, solder bonding, polymer bonding, direct bonding, etc. FIG. 34B illustrates the SIW device still comprising the two substrate films 11, 41. The original substrate layer is then removed in a next step using, for instance, any of the above mentioned methods. This substrate material removal may fully remove the substrate as is illustrated in FIG. 34C or alternatively keeps at least the substrate material in the walls 12, 13 of the SIW 10. The integration of the waveguide onto the second substrate 41 is generally necessary if the first substrate 11 is fully removed in order to achieve adequate mechanical stability of the resulting SIW 10.

The other substrate material 41 does not have to be selected to be well compatible with the irradiation procedure to be described herein. This means that, for instance, thicker substrates can be used and also substrate materials that are less suitable to be irradiated for the purpose of forming latent tracks of damaged material. The substrate 41 could therefore be made of, in addition to the previous mentioned materials, silicon, GaAs, glass, etc.

In further detail, still referring to the embodiment illustrated by FIG. 1, the walls 12 and 13 preferably comprise a composite material consisting of the dielectric thin film substrate material itself and conductive structures, hereby referred to as substantially vertical conductive wires. Typical conductive materials that are beneficial for use in the wires include metals, in particular high conductive metals and metal alloys, such as copper, nickel, silver and gold. However, the conductive wires can also be made from any other material that can be deposited or formed into conductive wires in the substrate material, such as other metals, metal alloys, semiconductors and conductive polymers.

The number and size of the conductive wires in the walls 12 and 13, and the distance between them, are chosen so as to minimize leakage losses of the guided power through the walls 12 and 13 of the SIW 10. The number and size of the conductive wires correspond to a total conductive or metal content that can be varied from sub-percentages up to close to 100%, such as from about 1% to about 100% ($\leq 99.99\%$), of the total volume of the composite material in the walls 12, 13. In the case of a metal content of near 100%, the walls 12, 13 comprise conductive wires that are substantially coalesced into continuous conductive walls 12, 13. In particular with the higher percentage of wire occupancies in the walls, wire overlaps may occur. Such wire overlap is generally a part of the stochastic process of particle bombardment. The wire overlaps do not degrade the SIW device performance and are considered a natural outcome of the irradiation process.

In principle, walls 12, 13 with high metal or conductive material contents, such as 10%-100%, are the most beneficial for SIWs. However, the removal of water that has been absorbed by the dielectric substrate material and is trapped in between the vertical wires becomes more difficult with increasing metal content since the wires become more closely packed. Hence, in the case of thin film substrate materials that absorb relatively high amounts of water and humidity, such as more than around 1%, including polyimide foils, lower metal contents of preferably 1%-5%, have been found to be more beneficial. Alternatively, in the case of thin film substrates that have relatively high water absorption, the fabricated SIWs 10 can be subjected to additional post treatment steps such as baking at high temperatures, i.e. more than 100° C., in vacuum or reduced pressure to remove the absorbed water. In this case, walls 12, 13 with high metal contents become more beneficial again.

The conductive wires forming the walls 12, 13 together with any dielectric substrate material in between, preferably extend from the bottom conductive layer 15 up the upper conductive layer 14. The wires and the conductive layers 14, 15 therefore constitute an effective cage or waveguide for an electromagnetic wave without significant losses through the walls 12, 13 due to the particular arrangement of a dense "forest" of very thin conductive wires.

In further detail, still referring to the embodiment of FIG. 1, the distance between the individual conductive wires in the walls 12, 13 is preferably 10 μm or less. The conductive wires have typical average diameters of one or a few tens of nanometers up to one or few micrometer, preferably less than 10 μm and more preferably less than 5 μm. The thinner the wire diameters, the closer the wires can be packed in the walls 12, 13 to thereby minimize any power leakage out from or into the substrate integrated waveguide. Suitable wire diameters are therefore preferably chosen from 0.02 μm up 10 μm or up to 5 μm, preferably from 0.2 μm to 3 μm, where the formation of thinner wires is mainly limited by the etching and electroplating process when forming the wires. It is though anticipated by the present invention than thicker wire diameters than 10 μm could be used at least for some of the wires, although being less preferred.

The number of wires per $cm^2$ is chosen to be at least $10^4$ wires/$cm^2$ to prevent unacceptable power leakages between the wires. The density of wires is preferably at least $10^6$ wires/$cm^2$. An upper limit for the wire density is mainly limited by production cost. The density is consequently preferably up to $10^{14}$ wires/$cm^2$, more preferably up to $10^{13}$ wires/$cm^2$, such as up to $10^{12}$ wires/$cm^2$. From a process cost perspective the density of the wires in the walls 12, 13 is beneficially chosen between $10^6$ and $10^{10}$ per $cm^2$. A preferred interval for the wire density is consequently from about $10^6$ to about $10^{10}$ wires/$cm^2$, preferably from about $10^7$ to about $10^{10}$ wires per $cm^2$, such as about $10^7$-$10^9$ wires/$cm^2$. The above given preferred wire densities for the walls 12, 13 are average densities. As a consequence and since the particle bombardment that is utilized in order to subsequently form the wires can be performed stochastically or pseudo-randomly, some small, individual portions of the walls 12, 13 may indeed have a wire density that is below the above given preferred ranges. However, the average density in the walls 12, 13 should meet the requirement of $10^4$ wires/$cm^2$ and preferably any of the listed preferred ranges in order to prevent unacceptable power losses at the desired operation frequencies.

In further detail, still referring to the embodiment of FIG. 1, the top layer 14 and bottom layer 15, comprises, as was mentioned above, thin films or layers of conductive material, such as conductive metals, that may be structured using conventional printed circuit board fabrication techniques. The thin films of metal can beneficially be made of copper, gold, or silver with or without thin film metallic adhesion layers such as chromium or titanium. The thickness of the thin film metal layers is preferably 20 μm or less. In the art, electrodeposition of the above mentioned metal films is often employed to achieve a metal film thickness in the order of 10-20 μm. However, other techniques for providing the metal films, such as rolled metal films, can also be used. For instance, rolled copper has a thickness in the order of 70 μm (corresponding to ¼-2 oz). Thus, also metal films with a thickness above 20 μm are also possible, depending on the particular metallization technique used.

As was mentioned in the foregoing, the conductive film can be a single layer or multi-layer structure of conductive metals, metal alloy(s) or other conductive materials.

Figure 2A:
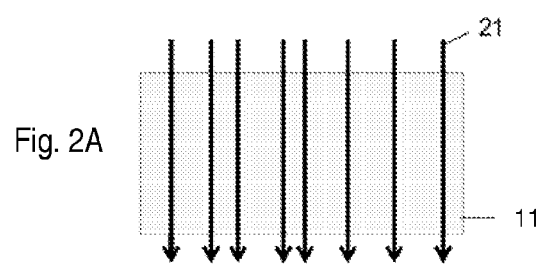
FIGS. 2A to 2C schematically illustrate substrate pre-treatment steps enabling the fabrication of an embodiment of a SIW.
Figure 2B:
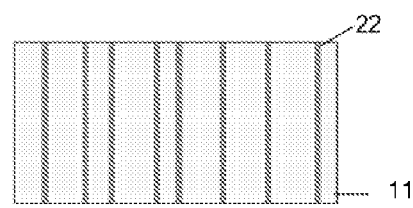
Figure 2C:
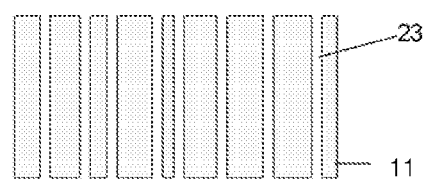

In further detail, still referring to the embodiment of FIG. 1, the fabrication of the vertical metallic wires that constitute the composite material in the vertical walls 12 and 13, is enabled by pre-treating the entire or at least certain selected surface sections of the thin film substrate material 11 with irradiation with accelerated ions 21, as schematically shown in FIG. 2A. Thereafter, the irradiated thin film substrate 11 is further processed to form pores through the substrate material, in which pores the conductive wires can be formed. The pores are preferably formed in a subsequent etching process, as shown in FIG. 2C. The accelerated ions applied in FIG. 2A have a kinetic energy that is large enough so that at least some of the ions with full certainty will create latent ion tracks 22 in the electrically insulating layer of the thin film substrate 11 as shown in FIG. 2B. The concept of latent ion tracks is intended to indicate the thin continuous channels of modified material that is created in electrically insulating materials due to the energy transfer from the accelerated ions to the thin film substrate material. The latent ion tracks can be preferentially etched by chemical etching to form long thin vertical pores 23 that can perforate all or part of the entire thickness of the thin film substrate material 11 as shown in FIG. 2C. The etching can be conducted according to different etching techniques, such as wet etching, anisotropic wet etching or plasma etching.

A typical pretreatment process for the manufacture of the pores is further described in the experimental section.

Figure 3A:
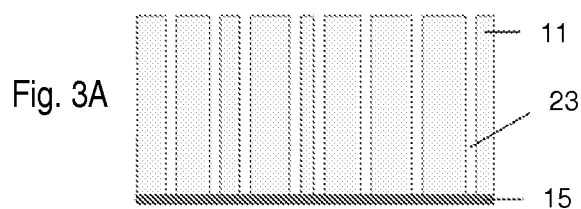
FIGS. 3A to 3D schematically illustrate fabrication steps of conductive wires for a SIW.
Figure 3B:
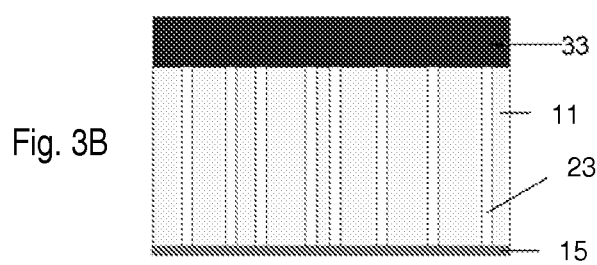
Figure 3C:
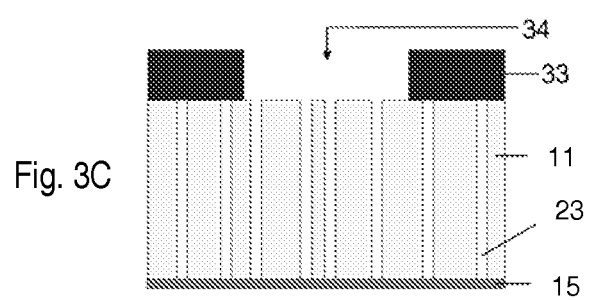
Figure 3D:
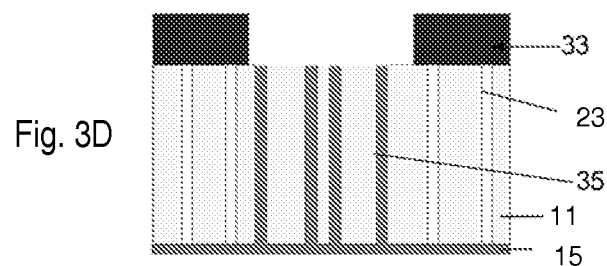

In further detail, with reference to the embodiment in FIG. 1, the fabrication of the conductive wires 35 as shown in FIGS. 3A to 3D is enabled by filling certain selected pores with the conductive material, such metal, by a suitable process, such as electrodeposition, electro-less (auto-catalytic) deposition, chemical vapor deposition (CVD), etc. as shown in FIG. 3D.

In an optional but preferred step, the selected pores that are to be filled with conductive material are defined by an opening 34 in a masking layer 33 that is advantageous applied onto the thin film substrate 11 and structured using conventional printed circuit board fabrication techniques as shown in FIG. 3B and FIG. 3C. The lateral thickness of the resulting vertical walls 12 and 13 in FIG. 1 is determined by the possible spatial resolution of the printed circuit board fabrication technique that is used to define the opening 34 in the masking layer 33 and can be chosen down to at least 2 μm or even smaller. An illustrative fabrication process is described further in the experimental section.

Usage of a masking layer 33 applied to a surface of the substrate is in particular advantage in the case, the ion bombardment and pore fabrication is performed for substantially the whole substrate surface and thereby not merely limited to those portions of the substrate in which the walls are to be formed. In such a case, the masking layer 33 is removed along those portions of the substrate 11 in which the wires 35 are to be formed and thereby to constitute the walls of the waveguide. Remaining portions of the substrate 11, corresponding to the substrate portion subsequently enclosed by the waveguide and substrate portions outside of the walls to be formed are thereby preferably covered by the masking layer 33 to prevent any wire formation in those substrate portions.

If the ion bombardment is, however, controlled and guided to so that the irradiated ions or particles substantially merely impact on those substrate portions in which walls are to be formed, no masking layer 33 is required as the formed pores 23 from the pre-treatment are only present in those portions of the substrate 11, in which the wires 35 are to be formed.

Figure 41:
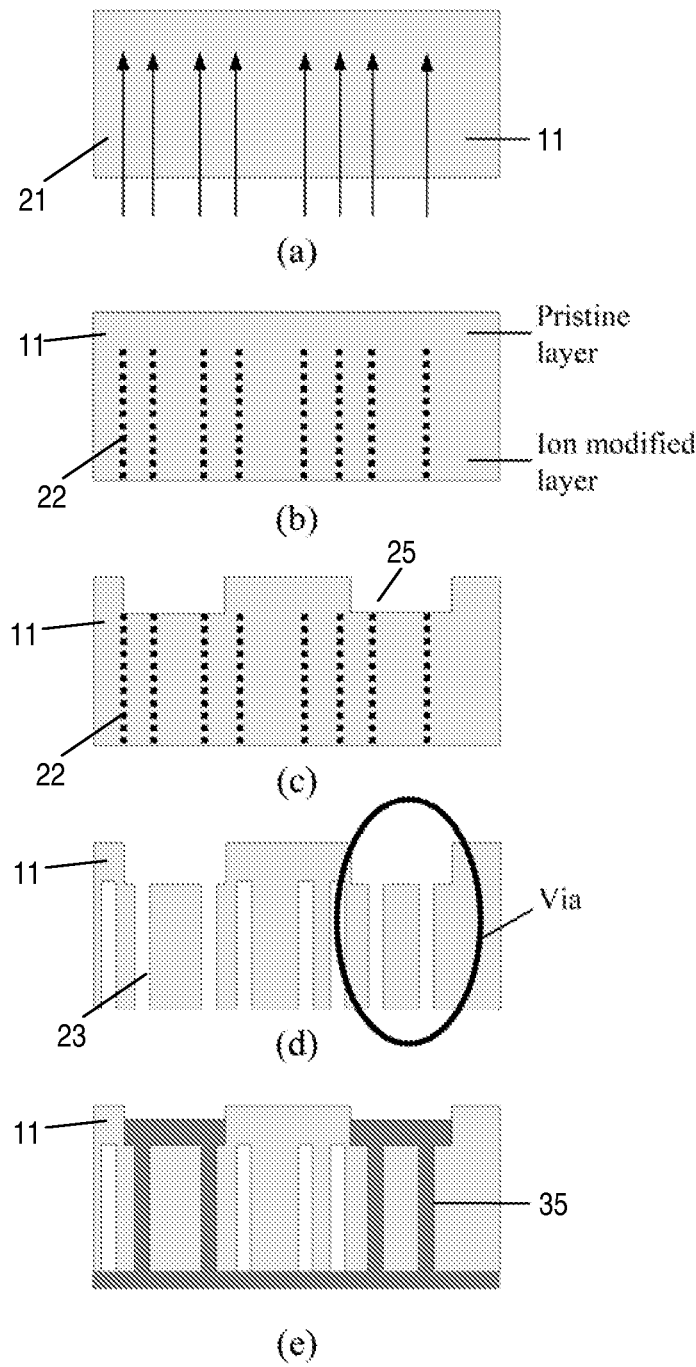
FIGS. 41A to 41E schematically illustrate substrate pretreatment and wire fabrication according to another embodiment.

FIG. 41 illustrates an alternative manufacturing process, in which no masking layer is required. In clear contrast, the substrate 11 is irradiated to a certain height, i.e. not through its complete thickness, see FIG. 41A. The pristine layer then serves as making layer when defining the areas that are to be electroplated, see FIGS. 41B to 41E. Briefly, irradiation 21 with energetic heavy ions to a certain depth is applied in FIG. 41A. Each projectile ion leaves a track 22 of damaged material in its path. The resulting material is a composite two-layered material consisting of a layer of ion modified material, and an unirradiated pristine layer as is illustrated in FIG. 41B. Apertures 25 are machined into the pristine layer by UV-lithography and dry etching as is illustrated in FIG. 41C. Wet etching or other etching technique of the substrate 11 is used, as illustrated in FIG. 41D, to form the pores 23. The ion modified layer forms a porous layer where each ion track 22 corresponds to one pore 23. The pristine layer acts as a wet etch mask, and the apertures 25 define the pore structures. A conductive seed layer is deposited and submicron wires 35 are electrodeposited into the pores in FIG. 4E.

Figure 4:
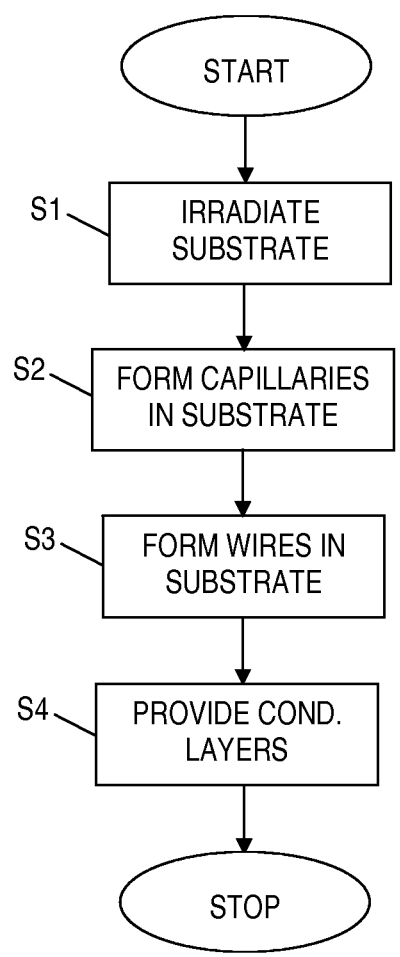
FIG. 4 is a flow diagram illustrating a method of manufacturing a SIW according to an embodiment.

In summary, the production of the SIW may be conducted as illustrated in FIG. 4. The method starts in step S1, where a substrate is irradiated to direct incident accelerated particles, preferably swift heavy ions, along at least a portion of the substrate in which the at least one wall of the SIW is to be formed. The accelerated particles, preferably ions, have an average velocity and mass selected to achieve an average kinetic energy that is adapted to the particular substrate material and thickness to allow at least a substantial part, preferably at least 80%, of the accelerated particles to fully penetrate through the substrate. Alternatively, lower energies to merely achieve penetration down to a selected depth in the substrate can be used. The particles penetrating into and preferably through the substrate will leave a multitude of latent tracks of damaged substrate material in the substrate and being more sensitive to, for instance, etching as compared to the remaining undamaged substrate material.

Step S1 may involve directing the particle radiation over substantially the whole substrate to form a target porosity in the substrate relating to the multitude of tracks of damaged material. The formed latent tracks are typically stochastically (randomly) distributed in the major substrate surfaces or in the selected portions thereof. The density of the latent tracks in the substrate material is preferably high enough to, later during the manufacture, enable of production of a wire density of at least $10^4$ wires/cm$^2$ in the at least one wall. Thus, the density of the latent tracks in the portion or portions of the substrate that correspond(s) to the wall or walls of the SIW consequently preferably has a track density of at least $10^4$ tracks/cm$^2$.

A next step S2 selectively removes substrate material from the tracks of damaged substrate material formed by the irradiation. This step S2 preferably involves etching to selectively remove the irradiated and damaged material but leaving the remaining undamaged substrate material basically unaffected or at least less affected by the etching action as the etching rate of the tracks is a few thousand times higher than the rest of the substrate material. The result of this material removal is the formation of a multitude of dense, small diameter capillaries or pores running through the thickness of the substrate.

A conductive material is filled in at least a selected portion of the formed pores to form a dense forest of conductive material running through the selected portion of the pores in step S3. The multitude of conductive wires becomes organized, due to the selective filling, to form at least one wall, preferably multiple, i.e. at least two walls, of the SIW. The density of the wires is preferably at least $10^4$ wires/cm$^2$ in the at least one wall.

The selective filling can be affected by coating at least a portion of a major surface of the substrate with a masking layer. A selected portion of the masking layer is then removed to expose some of the capillaries. The exposed capillaries are then filled with the conductive material to form conductive wires therein. These steps can be performed several times in order to form conductive wires in different portions of the substrate. Alternatively, apertures in the pristine portion of the irradiated substrate are used to achieve the selective filling.

Step S4 electrically connects respective first ends of the conductive wire with the top conductive layer and respective second, opposite ends of the wires with the bottom conductive layer to form the substrate integrated waveguide.

This step S4 may actually be a multi-step process, in which at least one of the bottom and top layer structures, preferably the bottom layer structure is first applied to one major side of the substrate after the formation of the pores but before forming the conductive wires in the pores. The other of the bottom and top layer structure is then preferably applied to the other opposite major surface of the substrate after the formation of the wires. The method then ends or the SIW is optionally further processed such as by removing water from the substrate material and/or removing selected portions of the substrate material as previously described.

An aspect of the invention relates to a SIW obtainable by the process disclosed in FIG. 4 and described above.

As was previously described, the substrate can be pre-manufactured with a respective conductive layer present on its opposite major surfaces. These conductive layers can indeed be present before the irradiation process and the following etching. In such a case, the growth or formation of the conductive wires will connect the wires to the respective conductive layers that can then be used directly as conductive top and bottom layer structure without the need for applying any further conductive layers or films to the substrate, although this is indeed possible.

Figure 40:
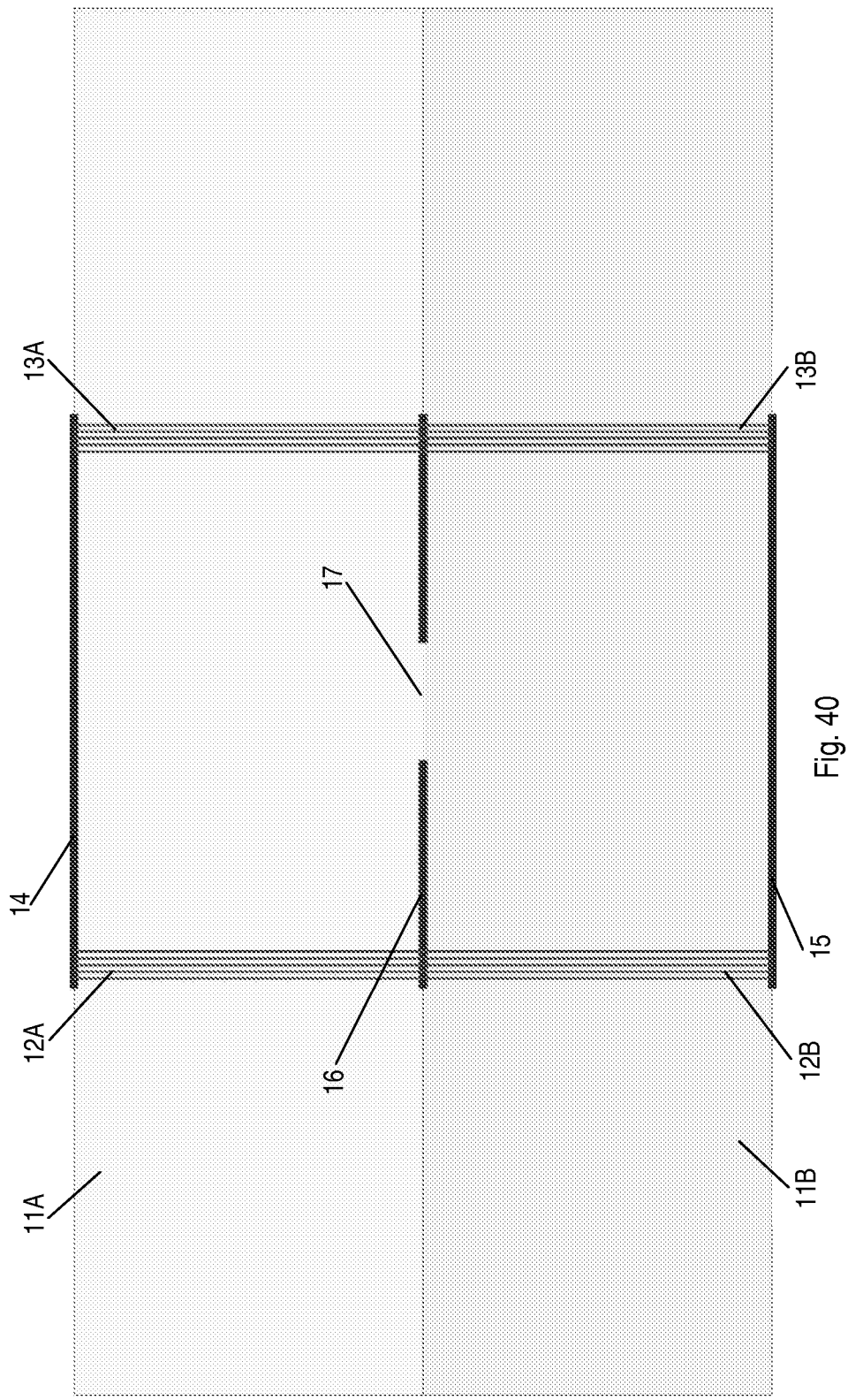
FIG. 40 is an embodiment of a substrate integrated waveguide comprising multiple stacked waveguides.

The SIW of the present invention can also be manufactured in the form of multiple stacked waveguides as is illustrated in FIG. 40. As is illustrated in the figure, functional layers containing SIWs can be assembled vertically. In such a case, an individual layer in the stack can optionally be electrically interconnected to subsequent layers by introducing one or more slots 17 in the metal layer 16 separating the two waveguides. Each waveguide stack therefore comprises a respective conductive top layer 14, 16 and a respective conductive bottom layer 16, 15, where the bottom layer of an upper SIW can be the same as the top layer of a below situated SIW or at least be electrically connected thereto. Each SIW further has walls 12A, 13A; 12B, 13B in the form of multiple wires according to the invention. The same or different substrate materials 11A, 11B can be used for the multiple stacked SIWs. Correspondingly, the conductive material of the top/bottom layers 14, 15, 16 may be the same or different as for the wire material, and wire height. The figure illustrates two stacked layers but other embodiments can use more than two such SIW layers.

Figure 42:
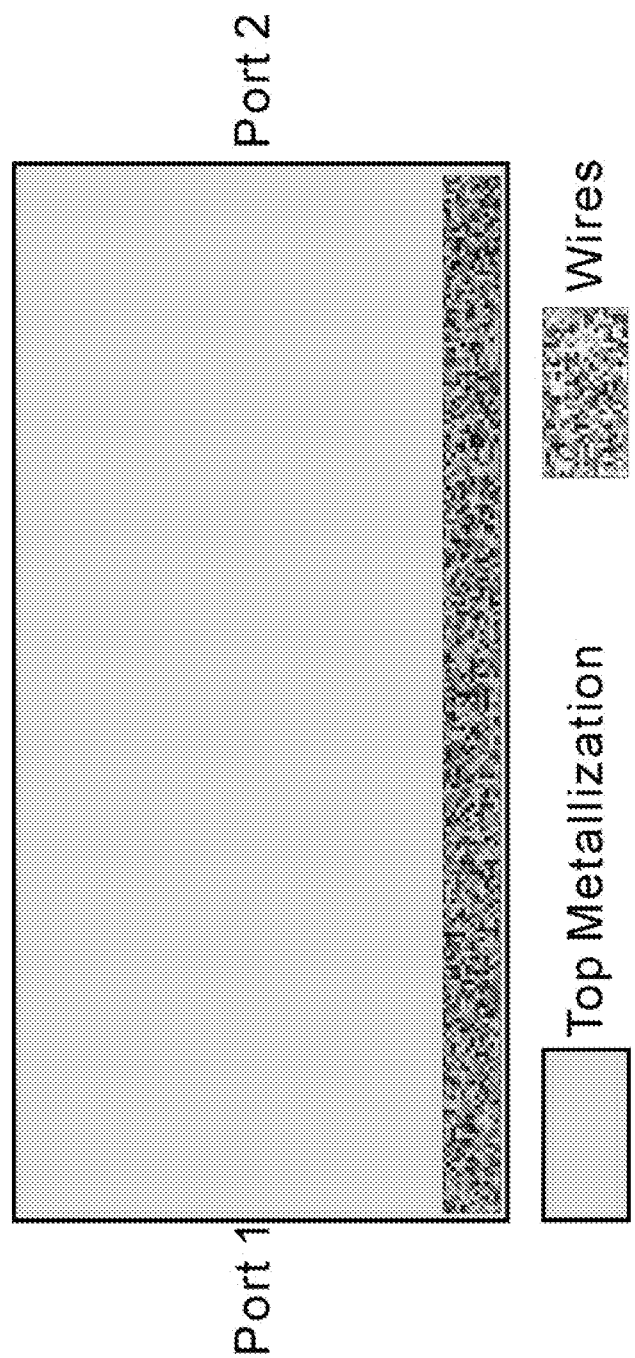
FIG. 42 is an embodiment of a half-mode SIW.

The SIW embodiment illustrated in FIG. 1 has two substantially parallel walls 12, 13 of the conductive material in the substrate 11 to define, together with the conductive top and bottom conductive layers 14, 15, a waveguide. The SIW 10 of the invention must, however, not necessarily comprise two walls 12, 13. In clear contrast, SIWs manufactured with a single wall can be used in the art and is often denoted half-mode SIW in the art. FIG. 42 illustrates an embodiment of such a half-mode SIW having a single wall connected to the top and bottom conductive layers, of which only the top layer is shown in the figure.

Also more complex SIW-based structures having more than two wire-based walls can be manufactured, which is schematically illustrated in FIGS. 35-39.

In practical applications, the at least one wall of the SIW must not necessarily be continuous but can include one or more radiating elements, e.g. slots or ports, arranged on one or more sides of the SIW. These slots are therefore portions of the walls that lack any conductive wires.

The advantages of the present invention include, without limitation, low leakage losses of the guided power in the substrate integrated waveguide compared to existing prior art. The leakage losses of a demonstrated prototype of the presented invention were estimated to be less than 0.05 dB at 79 GHz in a polyimide foil. These leakage losses can potentially be decreased by using higher metal contents in the composite material comprising the vertical walls. The lower leakage losses lead to higher possible operation frequencies for the devices. This, in turn, leads to new possible high frequency applications for devices in flexible printed circuit boards. Further advantages are the achievement of devices with such low leakage losses using conventional low-cost printed circuit board fabrication techniques.

In a broad embodiment, the present invention is a building block for high frequency devices using waveguides. The present invention can be combined with other components to form more complicated SIWs such as bent waveguides, FIG. 20, and SIW-based structures such as couplers, FIG. 35; filters, FIG. 36; power dividers/combiners, FIG. 37; resonators, FIG. 38; Rotman lenses, FIG. 39; antennas and antenna arrays, FIGS. 16 to 20.

Applications in the millimeter wave (mm-W) range have recently been introduced in several commercial products. Among these applications, automotive radar systems have been identified as a significant technology for the improvement of road safety. Short and long range radar sensors are under development for features such as collision warning, lane change assistance, and blind spot monitoring. The 79 GHz frequency range (77-81 GHz) has been considered the most suitable band for short range radars. Further applications can be found in areas such as wireless communication networks (60 GHz) and passive millimeter wave imaging (94 GHz).

SIW have received attention in mm-W applications due to their electromagnetic compatibility (EMC), low insertion loss, low-cost, and ease of integration with planar circuits. A number of mm-W structures incorporating SIWs have been demonstrated including antennas, waveguide filters, directional couplers, and circulators. The SIW of the present invention can therefore be implemented in such mm-W structures.

EXPERIMENTS

SIW with Metal Wire Walls

SIWs are presented and demonstrated in a flexible printed circuit board (flex PCB) for application in the 77-81 GHz range. The vertical walls of the SIWs presented herein consist of multiple electrodeposited metallic wires. The diameters of these wires, and the spacing between them, are in the order of hundreds of nanometers. Hence, the walls can be seen as continuous metallic walls, and leakage losses through the walls become negligible. In turn, the SIWs can operate at higher frequencies compared to previously presented structures that are realized with PCB fabrication processes. The attenuation of the SIWs is comparable to that of microstrip lines on the same sample. The SIWs are successfully demonstrated in a SIW-based slot antenna. The antenna gain along the z-axis (normal-to-plane) was found to be around 2.8 dBi at 78 GHz which is in agreement with the simulated values.

Concept

Figure 5A:
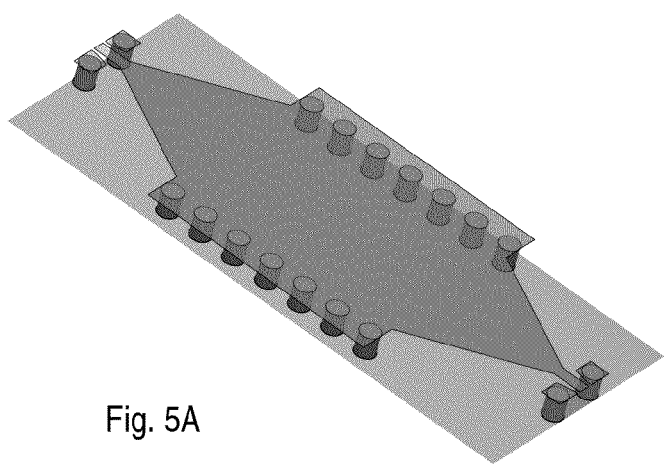
FIG. 5A is a schematic illustration of a SIW structure fabricated using prior art PCB processes.
Figure 5B:
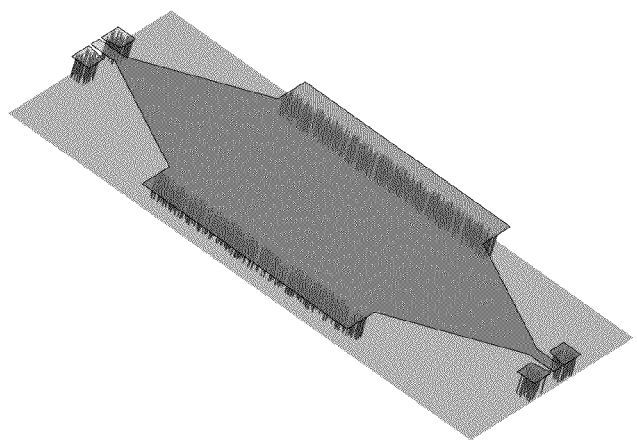
FIG. 5B is a schematic illustration of a SIW structure having vertical walls and grounding pads comprising multiple metallic wires.

The vertical walls of the SIWs presented herein differ from previously presented structures, see FIG. 5A, in that the periodically spaced through-hole vias are substituted by a 'forest' of metallic wires, as illustrated in FIG. 5B. The diameter of these wires, and the spacing between them, is in the order of hundreds of nanometers instead of hundreds of micrometers. The SIW structures are grounded using through-hole vias that also consist of multiple submicrometer sized wires.

Materials

The SIW structures presented herein are manufactured in a polyimide flexible PCB foil (76 μm thick Kapton HN® from DuPont). Flexible PCBs are common components in many commercial products today due to their lightness, flexibility, and low-cost manufacturing techniques. Polyimide foils are a common choice of substrate material due to high temperature stability and chemical resistance, as well as favorable electrical, physical and mechanical properties.

The polyimide foils are pretreated according to the invention to make them porous. The pretreatment steps consist of irradiation with swift heavy ions and subsequent wet etching, although other etching or non-etching techniques may be used. Each energetic ion that travels through the foil leaves a track of damaged material in its path. The etch rate along these damage tracks are orders of magnitude higher than the surrounding pristine material, and the tracks can therefore be selectively etched to form vertical capillaries through the full thickness of the foil (pores). This technique is called ion track technology, and is treated in detail elsewhere, e.g. [11-14, 17].

Figure 6:
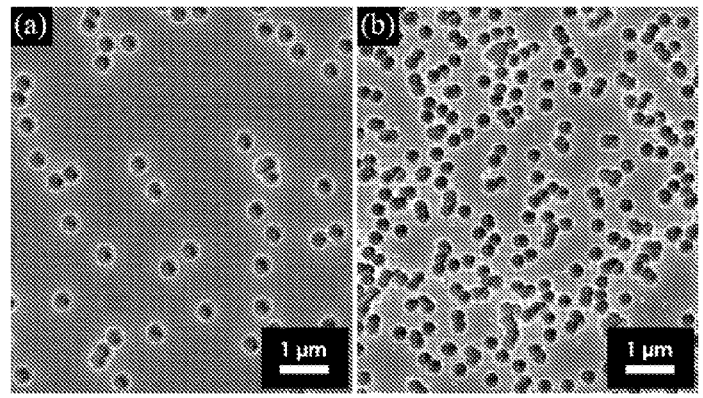
FIGS. 6A and 6B illustrate pore openings of the surface of polyimide foils with low porosity (A, 3%) and high porosity (B, 17%)

Two different foil porosities were used in this experiment: 3.0±0.5% and 17±1% (see FIG. 6), hereby referred to as low and high porosity, respectively. The porosity corresponds to the percentage of the volume of the foils that is etched into pores, and is defined by the pore density (number of pores per unit area) and the size of the pores (diameter). Both porosities were used in a first fabrication batch where the dielectric properties of the porous foils were characterized. In the second fabrication batch, the lower foil porosity was used.

To achieve these porosities, the foils were irradiated with 8.3 MeV/nucleon xenon ions at the Thé Svedberg Laboratory (Uppsala, Sweden) using two fluencies: $7 \cdot 10^7$ and $5 \cdot 10^8$ ions/cm$^2$, and were subsequently etched in a sodium hypochlorite solution (VWR International) and boric acid (36 g/l) at 60° C. for 180 minutes.

Simulations

Simulations were performed using Ansoft HFSS®. The first set of simulations was performed prior to measurements. As the dielectric properties of porous Kapton foils have not been previously characterized, the simulations were based on a linear approximation of the relative permittivity of the foils as a function of porosity. For a given frequency, and in a loss-less case, the relative porosity was approximated as, $$\epsilon_{porous} = \epsilon_r(1-\eta) + \epsilon_a \eta \quad (1)$$

where $\epsilon_{porous}$ is the relative permittivity of the foils, $\epsilon_r$ and $\epsilon_a$ are the relative permittivity of the solid polyimide and air, respectively, and η is the porosity of the sample. $\epsilon_r$ was calculated to be 3.2 at 80 GHz by extrapolation from values found in [15]. The sample porosity, η, was chosen to be 3% for the low porosity case, and 17% for the high porosity case, leading to a relative permittivity, $\epsilon_{porous}$, of 3.1 and 2.8, respectively.

A second set of simulations was performed after measurements on ring resonators (back simulations) to find the actual relative permittivity and loss tangent of the foils with different porosities. Finally, when the dielectric and loss characteristics of the porous foils were characterized, a third set of simulations was performed so as to optimize the geometry of the SIW structures for a second fabrication batch.

In all the simulations, the SIW vertical walls and the grounding vias were approximated as solid metallic structures.

Fabrication

An outline of the fabrication process is illustrated in FIGS. 3A to 3D. Two sample batches were fabricated. The first batch was fabricated to characterize the material properties of the porous foils, and the second batch was fabricated with optimized structure geometries. The fabricated structures in each sample batch are described in Table 1. The SIWs were designed so as to carry only the fundamental mode, $TE_{10}$. Furthermore, the dimensions of the SIWs were chosen for operation between 70 GHz and 90 GHz. The microstrip lines had a characteristic impedance, $Z_0$, of 50Ω, while the SIWs had a wave impedance, $Z_{TE}$, of 289Ω and 307Ω, for the first and second fabrication batches, respectively. In addition, a SIW-based slot antenna was fabricated.

TABLE 1

Fabricated structures

| | Porosity | Dimensions |
|---|---|---|
| Batch 1 | | |
| Ring resonators | Low | Outer diameter = 573 μm |
| | | Inner diameter = 947 μm |
| Ring resonators | High | Outer diameter = 588 μm |
| | | Inner diameter = 980 μm |
| Microstrip lines | Low | Length = 4.2 mm, 7.0 mm |
| | High | Width = 196 μm |
| SIW | Low | Length = 7.0 mm |
| | High | Width = 1.6 mm |
| | | Wall thickness = 100 μm |
| Microstrip-to-SIW transition | Low | Length = 1.60 mm |
| | High | Tapering angle = 21° |
| Batch 2 | | |
| Microstrip lines | Low | Length = 4.2 mm, 7.0 mm |
| | | Width = 187 μm |
| SIWs - short | Low | Length = 7.0 mm |
| | | Width = 1.5 mm |
| | | Wall thickness = 50, 100 μm |
| SIWs - long | Low | Length = 10 mm |
| | | Width = 1.5 mm |
| | | Wall thickness = 50, 100 μm |
| Microstrip-to-SIW transition | Low | Length = 1.58 mm |
| | | Tapering angle = 21° |

The porous Kapton HN® foils were conditioned by baking for 48 hours at 100° C. According to DuPont, this treatment results in lower dielectric constant and dissipation factor at high frequencies (note that this was found for 125 μm thick Kapton HN® films at 1-10 GHz) [15].

A 0.2 μm layer of gold was deposited onto one side of the porous foil by evaporation (see FIG. 3A). To completely cover the pore openings, a 0.6 μm layer of copper was deposited onto the gold layer by electrodeposition (J-PLATE Cu 400, J-KEM). Deposition was performed at a constant current density of 1 A/dm² at 33° C. A 30 μm thick dry photoresist film (Riston® FX 930, DuPont) was then laminated on the non-metallized side of the foil (see FIG. 3B) using a hot roll lamination machine (GX12 12" Mega Electronics).

Apertures defining the size and location of the SIW structures and grounding vias were opened in the resist layer by conventional photolithography (see FIG. 3C). The foils were exposed through a mask with UV light (12 mW/cm²), and the dry resist was spray developed for 2 minutes in a 0.8% sodium carbonate solution. After development, the patterned resist layer was cured with flood UV exposure for 20 s.

Each aperture uncovers a multiple of pores (see FIG. 3C). The SIW and grounding via wires were deposited into the pores by electrodeposition of nickel (see FIG. 3D). Nickel was chosen here as nickel electrodeposition in porous polyimide foils is a well-developed process with relatively high deposition rates and good corrosion properties.

The surface wettability of both the dry resist layer and the porous polyimide is important for achieving high electrodeposition uniformity. The wettability of the dry resist layer and the exposed polyimide was increased by reactive ion etching (in-house built) for 10 minutes using 50 sccm oxygen and 5 sccm freon at 80-90 mTorr and 100 W. To further increase wettability, the samples were soaked in 35% ethanol (1 min) followed by a solution of 40 g tin chloride per liter 0.02 M hydrochloric acid (1 min).

Deposition was performed at a constant potential of −0.95 V (versus a silver/silver chloride reference electrode) at 33° C. in an electrolyte consisting of 0.4 M nickel sulfate and 0.7 M boric acid. Deposition was continued after the wires reached the surface of the foil. Here, the individual wires merged together, filling the apertures in the dry resist layer up to a height of around 5-10 μm. After metallization, the dry resist layer was stripped in a 4% potassium hydroxide solution.

In the next steps, the top layer structures coupling the SIW walls were defined by UV-lithography. Again, a 0.2 μm thick layer of gold was deposited by evaporation and thickened by electrodeposition of 0.6 μm of copper. The top metal layer was structured by wet resist lithography (Shipley 1813, Shipley).

Finally, the samples were baked for 8 hours at 100° C. (atmospheric pressure) to remove moisture that was absorbed by the Kapton foil during the process steps.

Characterization

Transmission and reflection measurements were performed using a network analyzer (Agilent Technologies E8364B, PNA series), with mm-W VNA extenders from OML INC (V10VNA 2-T/R+V10VNA 2-T). Two ground-signal-ground (GSG) Picoprobes (Model 110H) with a pitch distance of 150 μm were used.

The dimensions of the individual wires were measured in a field emission scanning electron microscope (SEM, LEO 1550). The polyimide was removed in an oxygen plasma strip (Tepla 300) prior to SEM imaging of the embedded wires.

Results

Figure 7:
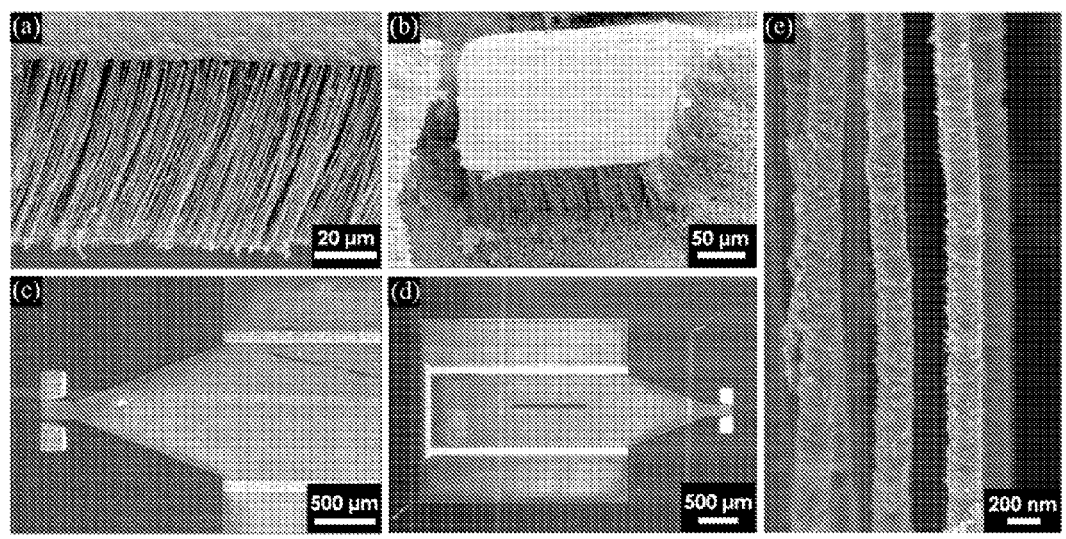
FIGS. 7A to 7E illustrate fabricated SIWs and grounding through-hole vias, with a SEM image of a segment of a SIW wall (A), SEM image of a grounding via (B), stereo optical microscope image of part of a SIW showing the grounding vias and the microstrip-to-SIW transition (C), SIW-based antenna showing the SIW, waveguide short, microstrip-to-SIW transition, slot and grounding vias (D) and SEM image of individual nickel wires in a SIW wall (E)

Resulting SIW and grounding via structures are shown in FIG. 7. The wires in the structures have a slightly bi-conical shape with larger diameters close to the surface of the foil. The median diameter of the wires was found to be 0.22 μm.

Figure 8A:
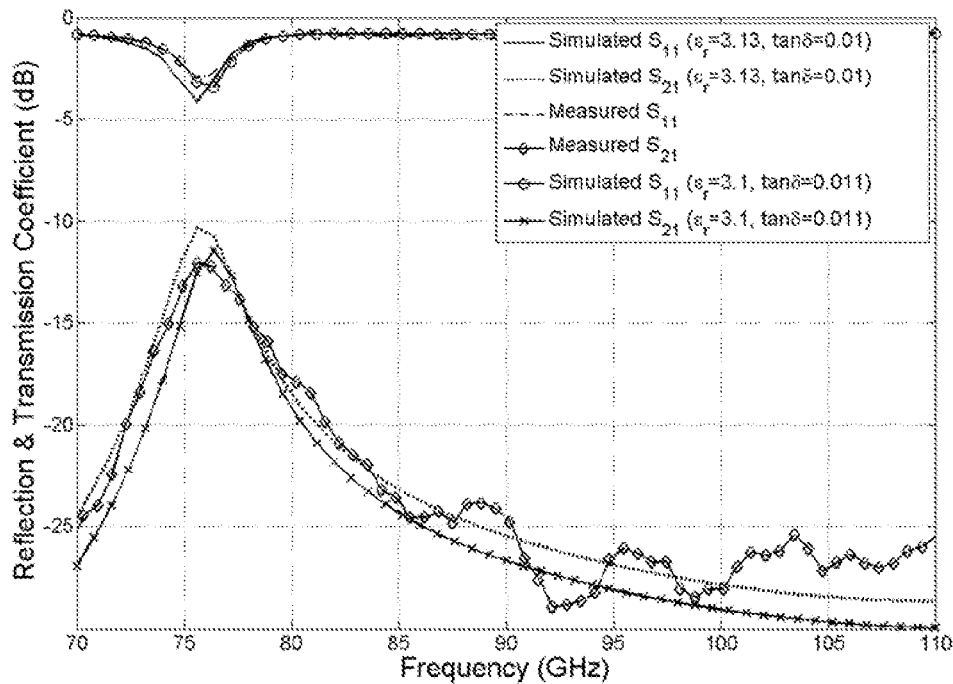
FIGS. 8A and 8B illustrate simulated, measured and back simulated reflections and transmission coefficients of a ring resonator on samples in the first fabrication batch with low porosity (A) and high porosity (B)
Figure 8B:
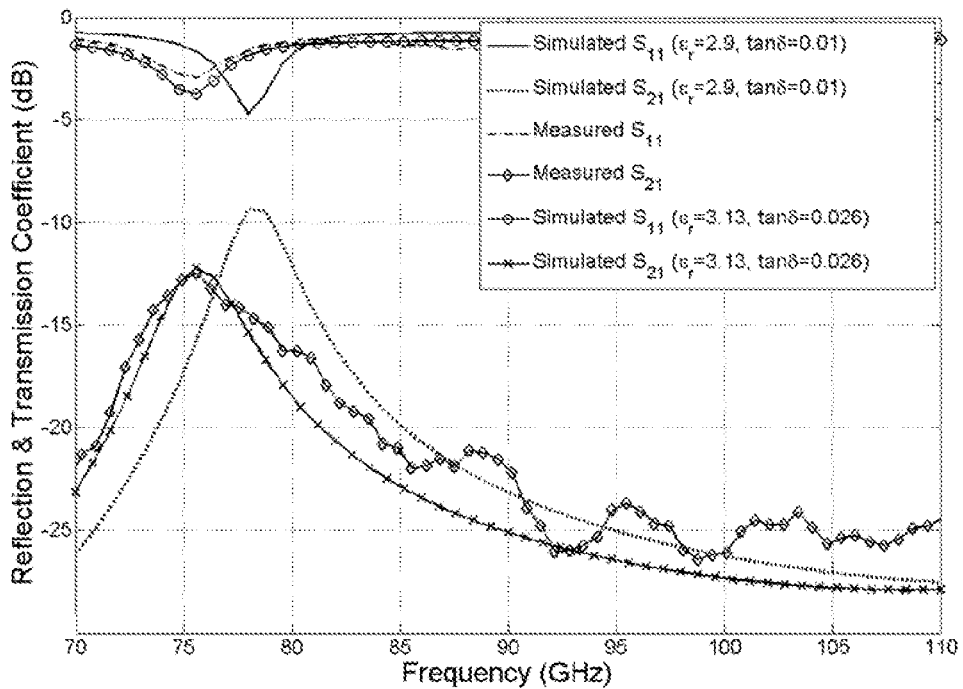

The simulated and measured reflection and transmission coefficients of ring resonators on the low and high porosity foils in the first fabrication batches are presented in FIG. 8. The actual relative permittivity ($\epsilon_r$) and loss tangent (tan δ)

for the different porosities were found by back simulations (see FIG. 8) and are shown in Table 2.

Figure 9:
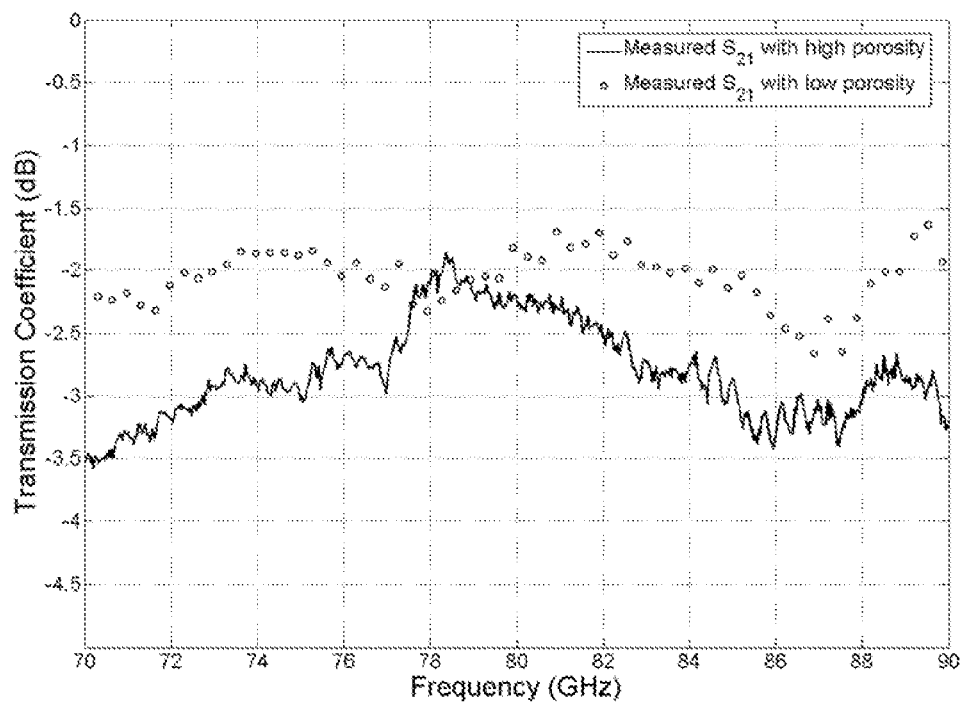
FIG. 9 illustrates measured transmission coefficients of SIWs in both low and high porosity foils with measured reflection coefficients less than −10 dB in both cases.

The attenuation per unit length of microstrip lines in both fabrication batches can also be seen in Table 2. The measured transmission coefficients of SIW structures in both low and high porosity foils in the first fabrication batch are shown in FIG. 9.

TABLE 2

Measured $\epsilon_r$ and tan δ of foils and attenuation of microstrip lines

| Sample | $\epsilon_r$ Estimated | $\epsilon_r$ Measured | tan δ | Attenuation of microstrip lines [dB/mm] |
|---|---|---|---|---|
| Batch 1 | | | | |
| Low porosity | 3.1 | 3.1 | 0.011 | 0.17 |
| High porosity | 2.8 | 3.1 | 0.026 | 0.32 |
| Batch 2 | | | | |
| Low porosity | — | 3.1 | 0.011 | 0.21 |

Figure 10:
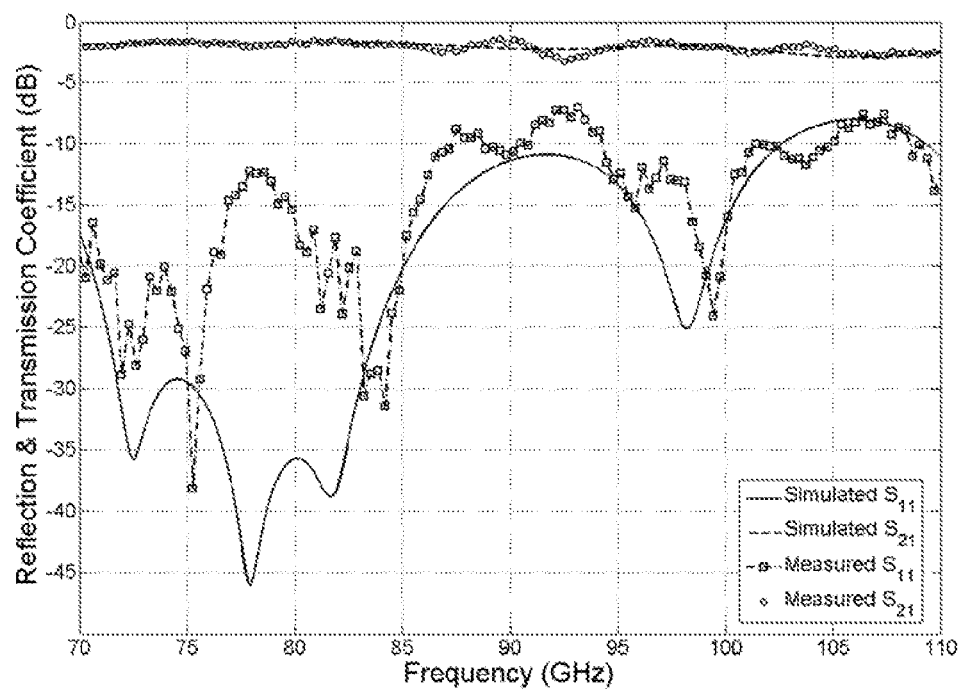
FIG. 10 illustrates simulated and measured reflection and transmission coefficients of SIWs in the second batch for a SIW wall thickness of 50 μm.

The measured and simulated reflection and transmission coefficients of a SIW (7 mm) in the optimized second batch are presented in FIG. 10. The attenuation per unit length of SIWs of different wall thickness (50 μm and 100 μm) in the same sample can be seen in FIG. 11. In the figure, the measurements are compared to the attenuation per unit length of microstrip lines on the same sample.

The transmission coefficient of a 7 mm microstrip in the second fabrication batch was found to be around −1.5 dB at 79 GHz. This corresponds to an insertion loss of approximately 0.1 dB for the grounding vias in each end of the microstrip line. The transmission coefficient of a 7 mm SIW in the same sample batch was found to be around −1.8 dB at 79 GHz. With an attenuation of 0.27 dB/mm (see FIG. 11), the insertion loss of the microstrip-to-SIW transition is found to be around 0.4 dB for each side (assuming a total of 0.2 dB insertion loss of the grounding vias).

Figure 12:
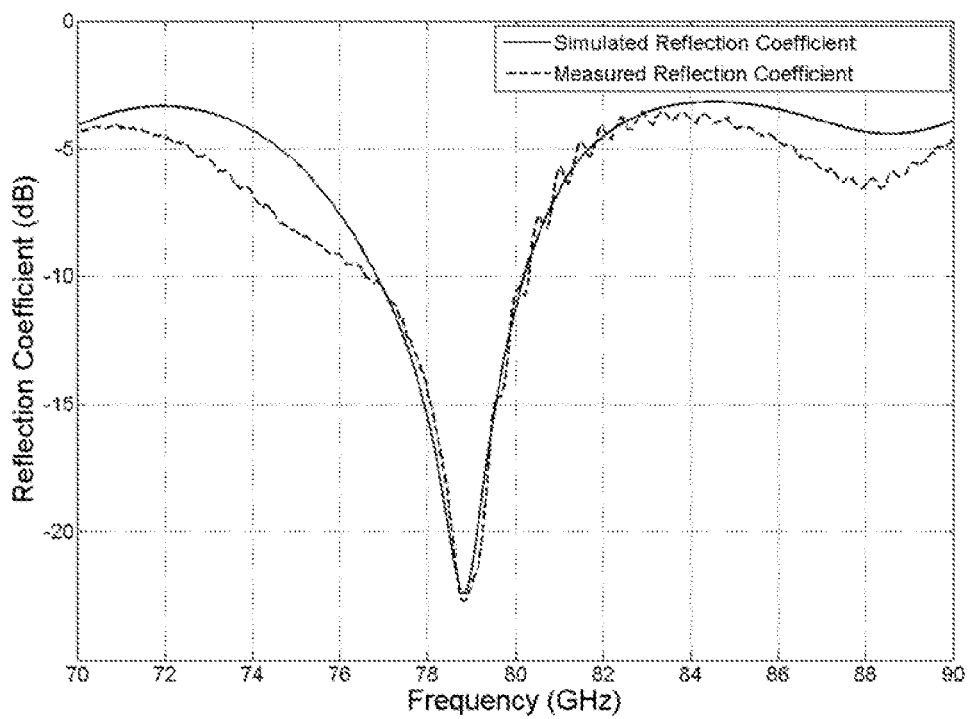
FIG. 12 illustrates simulated and measured reflection coefficients of the SIW-based antenna in the second batch.
Figure 13:
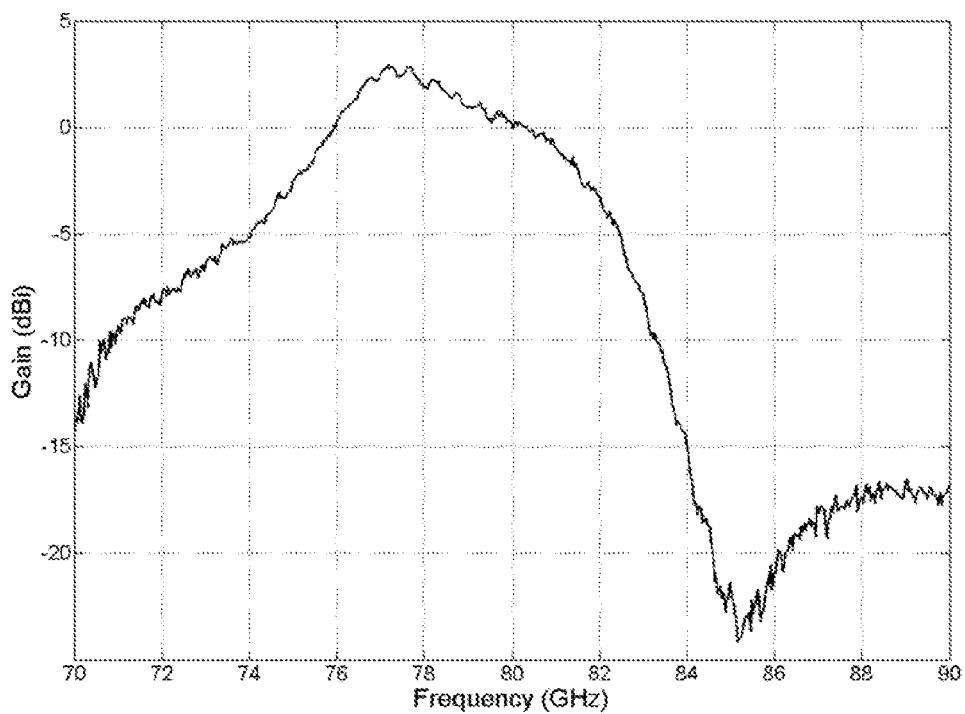
FIG. 13 illustrates measured antenna gain versus frequency along the z-axis, normal to plane.

The simulated and measured reflection coefficients of a SIW-based slot antenna in the optimized sample batch are shown in FIG. 12, in which the 10 dB return loss bandwidth is about 4.7% at 79 GHz. Antenna gain versus frequency along z-axis (normal to plane) is shown in FIG. 13. The maximum gain was found to be 2.8 dBi around 78 GHz. Simulated radiation patterns of the antenna in the xz-plane (along slot) and yz-plane (perpendicular to slot) are presented in FIG. 14.

Porous Foils for mm-W Applications

The performance of the presented SIWs and microstrip lines verify that porous polyimide track etch foils can be used as substrates for mm-W applications. Furthermore, as the use of foils that are already porous eliminates the need for via etching techniques such as drilling or laser ablation to form the vertical SIW structures, we can deduce that the porous foils can potentially be a viable low-cost alternative in microwave and mm-W applications where Kapton is used.

The relative permittivities of the porous samples at 79 GHz are comparable to the estimated value for pristine Kapton foils (extrapolated from [15]). The discrepancy between the simulated and linearly approximated (equation 1) $\epsilon_r$ values is larger for the high porosity sample. This can be explained as follows.

1) The surface area of the foil in contact with liquids is significantly higher in the high porosity samples, leading to higher water absorption and, hence, higher relative permittivity. This can also explain why the loss tangent of the high porosity foils is more than a factor 2 higher than for the low porosity ones.

2) The approximated dielectric constants in (1) are calculated considering a linear and isotropic dielectric material. However, as the foils are porous with air-filled pores in the direction perpendicular to the ring resonators, the foils are in effect anisotropic.

3) The behavior of the mm-W in the substrate may be affected by the porosity of the foil. In that case, such effects can become more evident with increasing porosity.

In addition to a higher loss tangent, the losses of the microstrip and SIWs in the high porosity foils are higher than for the low porosity samples (see Table 2 and FIG. 9). In this particular experimental setting, the low porosity foils have better performance as mm-W substrates. The low porosity foils were therefore chosen as substrates for the second optimized fabrication batch.

It should be noted that as the porosity, and hence the metal content of the resulting structures, decreases, the resistive and leakage losses of the SIW walls will increase. Below a certain porosity and metal content, these losses may become significant.

It is anticipated by the invention, that usage of a lower loss dielectric material, such as liquid crystal polymers (LCP), could be more advantageous than Kapton as LCPs are superior to Kapton when it comes to water absorption, dimensional stability, dissipation factors, and material cost.

Microstrip Line Attenuation and the Grounding Vias

The insertion loss of the grounding vias (0.1 dB for each side of a 7 mm microstrip line) indicates that multiple wire through-hole vias can be used as grounding vias for mm-W structures. The grounding vias were approximated to be solid metallic structures in the different simulations. Therefore, as the measured insertion loss and other loss measurements (e.g. the SIW losses in FIG. 10) are comparable with their simulated values, it can be seen that the performance of multiple wire vias as grounding vias is comparable to that of conventional solid metallic vias.

As mentioned before, nickel was chosen as the wire metal in the grounding vias and SIWs. It is believed that the losses of the grounding vias can be lowered by replacing nickel with copper which is commonly used in low-loss RF and mm-W applications. The resistivity of sub-micrometer sized copper wires is about a factor 8 times lower than nickel wires with comparable dimensions. Hence, resistive losses can be improved by using copper. However, to achieve uniform electrodeposition of copper wires in ion track porous foils, deposition is preferably performed at considerably lower rates in comparison with nickel deposition. Moreover, we find that nickel wires have higher corrosion resistance than copper, a fact that is of significant importance at the temperatures at which the foils are post-baked. However, by conducting the copper wire electrodeposition process at faster deposition rates and higher corrosion resistances, the aforementioned problems can be minimized.

SIWs

The demonstrated SIWs can successfully operate in the frequency range 70 GHz-110 GHz (see FIG. 10). The attenuation per unit length of the SIW structures is comparable with that of the microstrip lines (see FIG. 11).

In different SIW models based on the periodic metallic structures leakage losses are described as a function of the diameter of the vias and the distance between them. A limiting case is introduced in these models where the vias merge, and the leakage losses through become zero. However, in this case, the substrate becomes mechanically unstable. In the SIWs of the invention, the size of the wires and spacing between them are in the order of hundreds of nanometers. The vertical walls can therefore be seen as continuous walls that fulfill this limiting case without loosing the mechanical stability of the foil.

As the leakage losses are significantly reduced, the SIWs and SIW-based devices can even operate at frequencies higher than what has been disclosed in this experimental setting. In principle, the operating frequency will mainly be limited by the dielectric losses of the substrate. However, by improving the dielectric properties of the substrate, e.g. by optimizing the post treatment steps or transferring the technology to LCPs, this limiting frequency can possibly be increased. The lower operating frequency is limited by the thickness of the polyimide foil.

Figure 11:
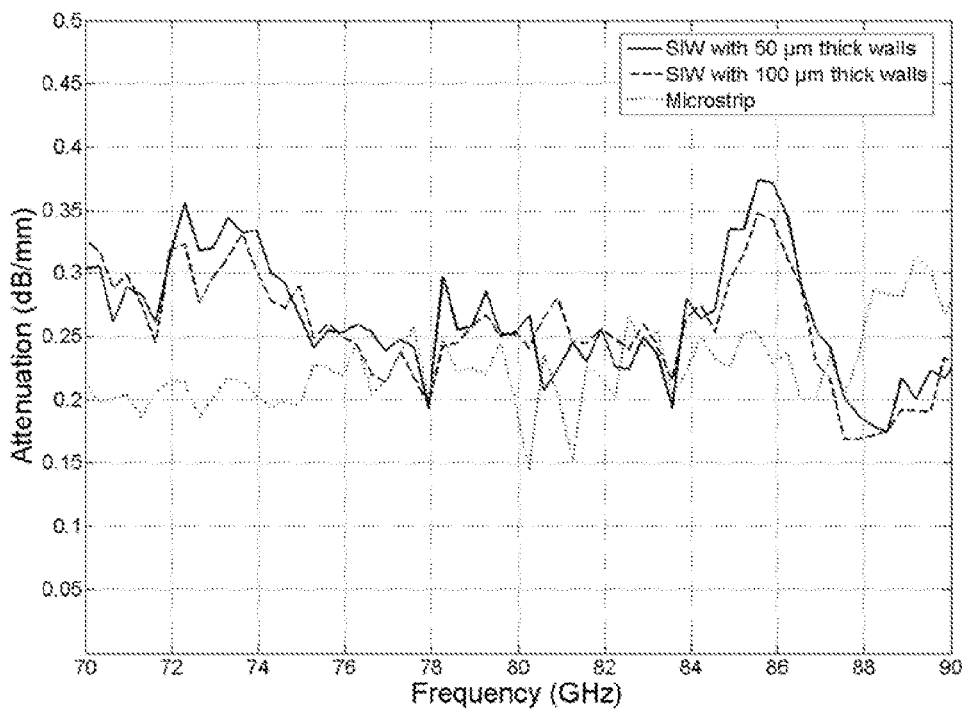
FIG. 11 illustrates attenuation per unit length of SIWs of different wall thickness and microstrip lines from a sample in the second batch.

The different wall thicknesses do not result in significant differences in the attenuation of the SIWs (see FIG. 11). This demonstrates that the SIW structures can be successfully fabricated with wall thicknesses down to at least 50 μm. The lateral dimensions of the SIWs presented in this paper can lead to further miniaturization of SIW enabled structures. The lateral dimensions and the continuous structure of the SIW walls are possible without losing the flexibility and mechanical stability of the flex PCB.

As with the microstrip lines, the losses of the SIW structures can be reduced by substituting the nickel with copper.

Moreover, the electrical performance of the SIWs can be further improved by transferring the fabrication process to thicker flexible PCB foils. However, it should be noted that the mechanical flexibility of the foils will decrease with increasing thickness.

SIW-Based Slot Antenna

The SIW-based slot antenna measurements demonstrate that the SIWs of the invention can be used in devices operating in the mm-W frequency range. The antenna gain along the z-axis (normal to plane) was found to be around 2.8 dBi at 78 GHz (see FIG. 13) which is in agreement with the simulated values (3.1 dBi at 79 GHz). The measured reflection coefficient is also in agreement with simulated values (see FIG. 12).

Figure 14A:
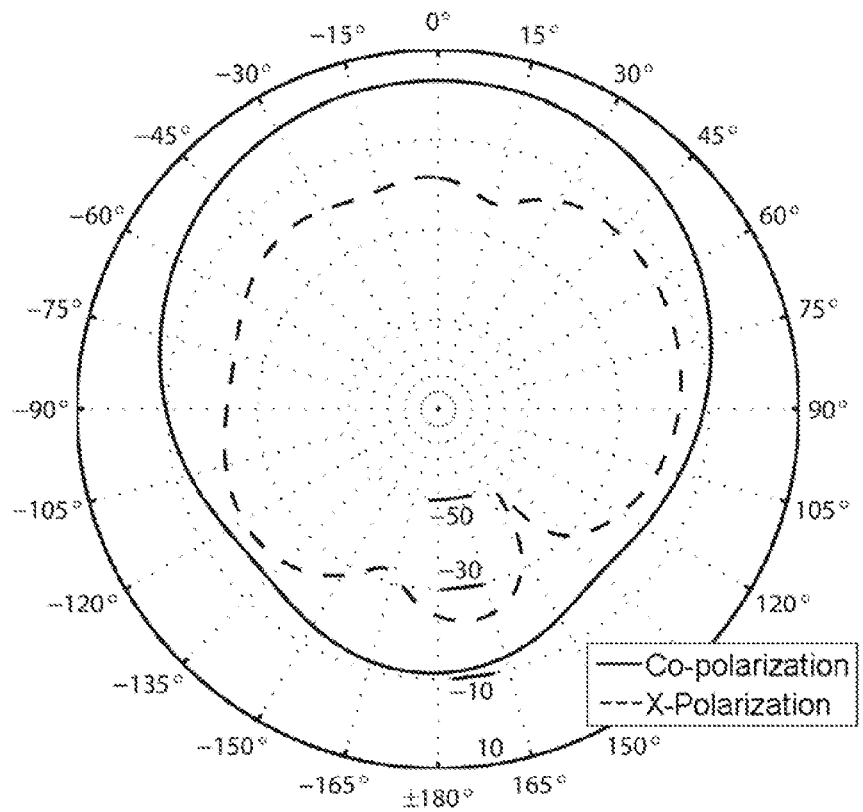
FIGS. 14A and 14B illustrate simulated radiation pattern of SIW-based antenna in the xz-plane, along slot (A) and yz-plane, perpendicular to slot (B)
Figure 14B:
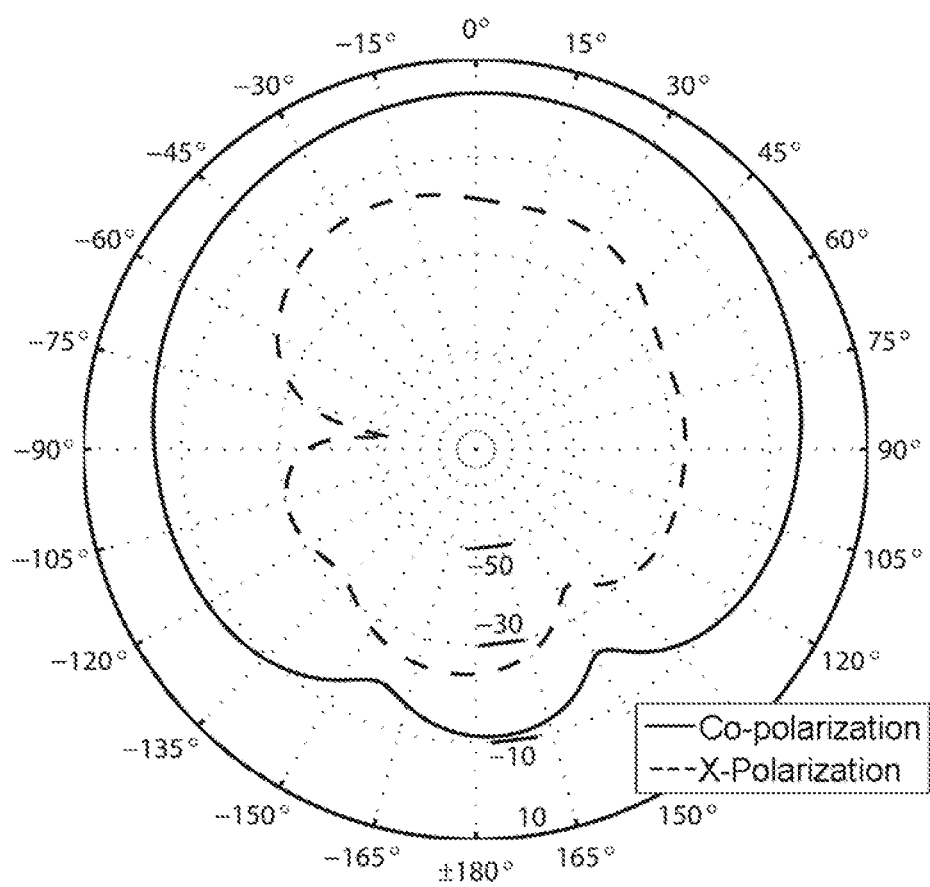

As shown in FIG. 14, the front-to-back ratio of the SIW-based slot antenna is greater than 15 dB and the cross-polarization is 15 dB lower than the co-polarization in both xz- and yz-planes. Moreover, simulated radiation patterns show broad beam coverage with a half-power-beam-width (HPBW) around 81° in the xz-plane and 93° in the yz-plane. To further characterize SIW-based slot antennas, radiation patterns can be measured in an anechoic set-up. In addition, SIW-based slot antenna arrays can be designed and characterized.

Conclusion

SIW structures fabricated using PCB fabrication techniques are successfully demonstrated for mm-W applications. The vertical walls of the SIWs consist of multiple electrodeposited metallic wires. Since the diameters of the wires and the spacing between them are in the order of hundreds of nanometers, the walls can be considered as continuous metallic walls. Hence, leakage losses that are associated with SIWs fabricated using low-cost PCB fabrication techniques become negligible. In turn, the SIW presented in this paper can operate at higher frequencies.

Through-hole vias consisting of multiple sub-micrometer wires are presented for use in mm-W applications. The performance of the vias for grounding is comparable to that of conventional solid metallic vias.

The performance of the SIW and the SIW-based devices is in good agreement with simulations. The attenuation of the SIWs is comparable to that of a microstrip. SIW wall thicknesses down to at least 50 μm can be used. The SIWs are successfully demonstrated in an SIW-based slot antenna. The gain and reflection coefficient of the antenna show that the SIWs can be used in mm-W devices.

SIW Based Slot Antennas

The design, fabrication and characterization of 79 GHz slot antennas based on substrate integrated waveguides (SIW) are disclosed in this experiment. All the prototypes are fabricated in a polyimide flex foil using printed circuit board (PCB) fabrication processes. A novel concept is used to minimize the leakage losses of the SIWs at millimeter wave frequencies. Different losses in the SIWs are analyzed. SIW-based single slot antenna, longitudinal and four-by-four slot array antennas are numerically and experimentally studied. Measurements of the antennas show approximately 4.7%, 5.4% and 10.7% impedance bandwidth ($S_{11}$=−10 dB) with 2.8 dBi, 6.0 dBi and 11.0 dBi maximum antenna gain around 79 GHz, respectively. The measured results are in good agreement with the numerical simulations.

Fabrication

The SIW-based structures presented in this experiment are fabricated in Kapton HN® polyimide foil. Due to lightness, flexibility, and low cost manufacturing techniques, as well as favorable electrical properties, polyimide foils are a common choice of substrate material in microwave engineering.

The fabrication process is performed as described in the previous experiment above. In brief, the process steps can be summarized as follows. Firstly, the Kapton foils are pre-treated by irradiation with swift heavy ions and subsequent wet etching. The energetic ions leave tracks of damaged material in their path referred to as ion tracks. These tracks are selectively etched during the wet etch step, forming pores. The entire surface of the foil is irradiated and etched, and the pores perforate the whole thickness of the foil. This technique is called ion track technology. In this experiment, the foil porosity (percentage of foil area that is etched into pores) was chosen to be 3%, based on the results of the previous experiment above.

A metal layer is then deposited onto one side of the porous foil, and a dry film photoresist is laminated on the opposite side of the foil. Apertures corresponding to the SIW-based structures are opened in the resist by UV-lithography, where each aperture reveals a group of pores. Wires are electrodeposited into the exposed pores forming the vertical SIW walls. After the wires reach the surface of the foil, they grow radially above the surface and merge. Finally, the dry resist layer is removed and a metal layer is deposited on the same side connecting the SIW walls, and structured using UV-lithography. Resulting structures are shown in FIGS. 7A, 7B and 7E.

Designs

Electrical properties of the SIWs using the described technique were characterized from 70 to 110 GHz in the experiment presented above. The relative permittivity ($\in_r$) and loss tangent (tan δ) of the polyimide foil with 3% porosity was found to be 3.1 and 0.011 at 79 GHz. The insertion loss of the grounding vias at each port was approximately 0.1 dB.

SIWs

Figure 15:
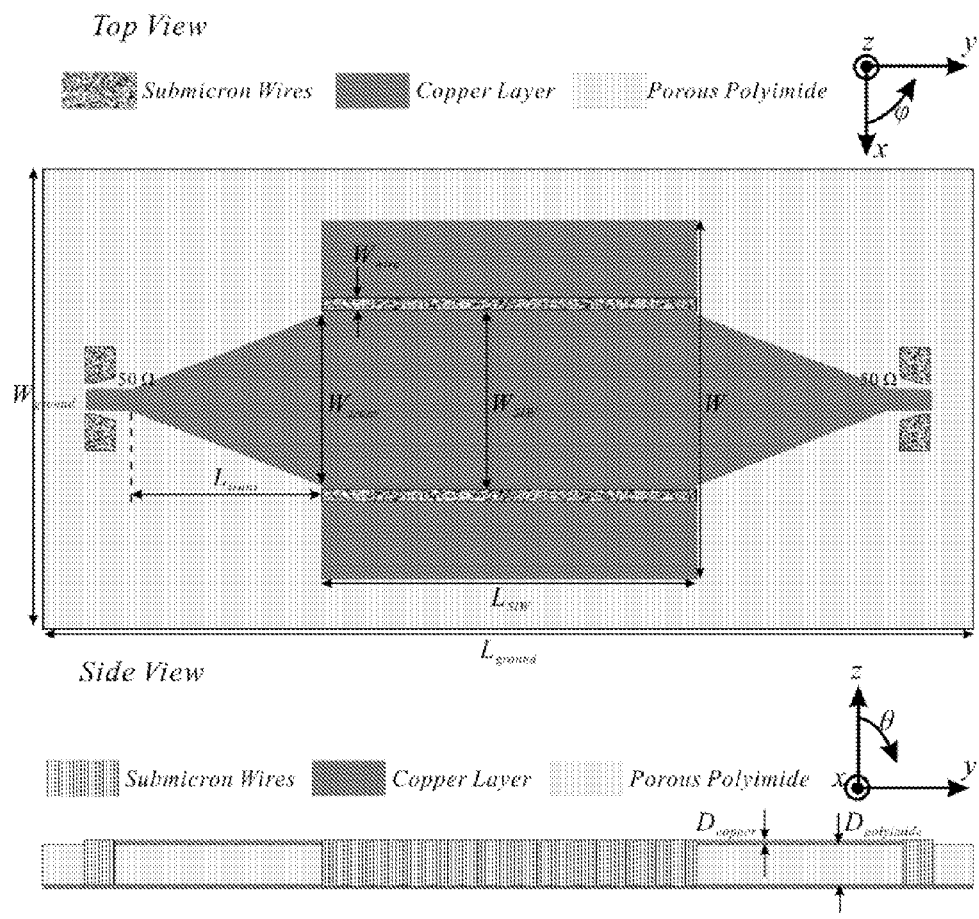
FIG. 15 is a schematic illustration of a SIW connected to a microstrip-to-SIW transition at each end.

SIW prototypes with two different lengths are fabricated. Both of them are connected to an identical microstrip-to-SIW transition at each end. The geometries are shown in FIG. 15 where the overall lengths are equal to 7 mm and 10 mm, respectively. In FIG. 15, dimensions are: $L_{ground}$=9 mm, $W_{ground}$=5 mm, W=3 mm, $L_{SIW}$=3.1 mm/6.1 mm, $W_{SIW}$=1.5 mm, $L_{trans}$=1.58 mm, $W_{trans}$=1.42 mm, $W_{wire}$=100 μm, $D_{copper}$=0.8 μm and $D_{polyimnide}$=76 μm. The width of the 50 f2 microstrip is 187 μm.

As shown in FIG. 7A, the submicron wires in the SIWs presented in this experiment are closely-packed and small. Thus the lateral walls can be seen as solid ones when calculating the cut-off frequency. The cut-off frequency for the $TE_{10}$ mode is found to be 56.8 GHz.

However, the approximation of the solid lateral walls is not valid in the analysis of the losses. The extra conductor and leakage losses resulting from the discrete walls have to be taken into account. The overall loss consists of the dielectric loss, the conductor loss of the two parallel copper layers and the vertical submicron wires, and the leakage loss. It is easy to calculate the first two, but the ones including the wires are more difficult to estimate. The sum of the conductor and leakage losses of the submicron nickel wires in the SIW lateral walls can, however, be approximated from the experimental and theoretical results.

SIW-Based Antennas

SIW-based single slot, longitudinal and four-by-four slot array antennas are fabricated. Schematics of all the presented antennas are shown in FIGS. 16-18, respectively.

Figure 16:
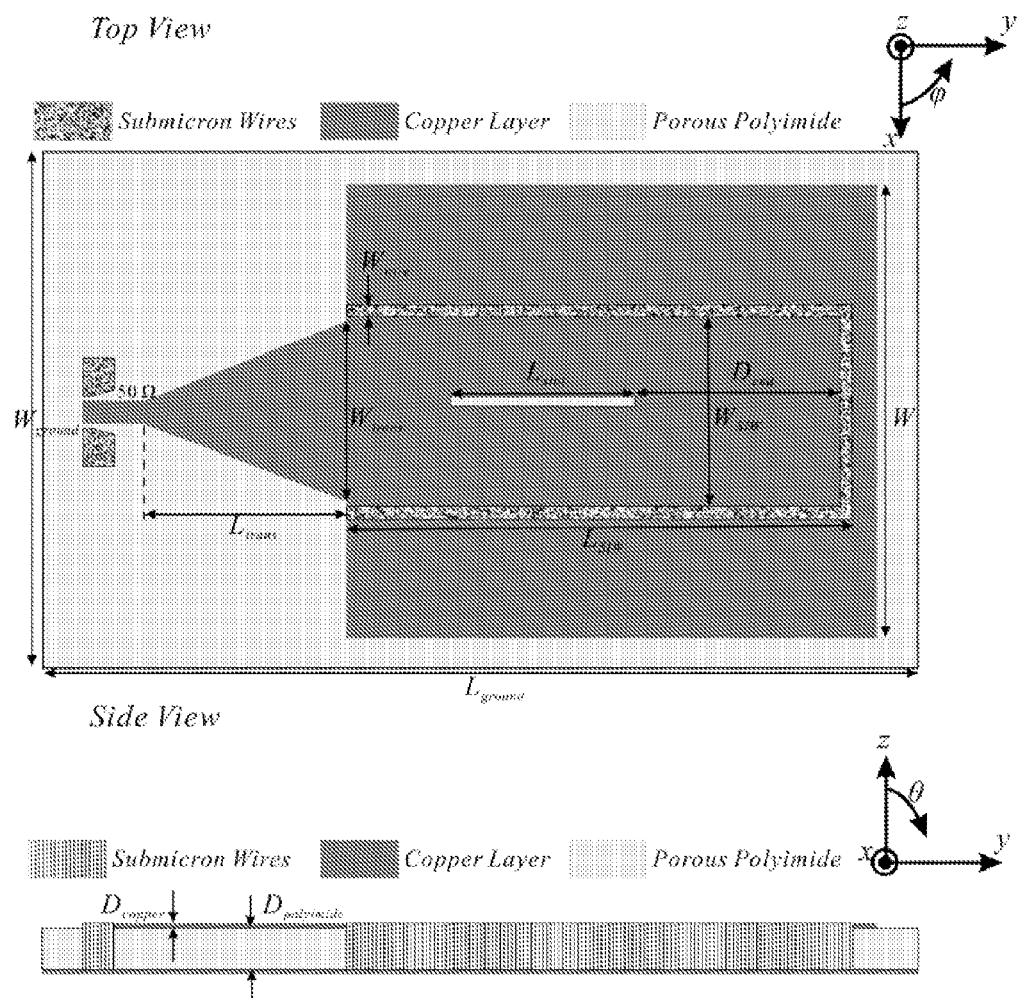
FIG. 16 is a schematic illustration of a SIW-based single slot antenna.

In FIG. 16, a slot is introduced in the top layer. The antenna resonance frequency is determined by the slot length that is approximately half of the effective wavelength. The antenna impedance matching is controlled by the slot offset. Usually the distance between the center of the slot and the shorted end of the waveguide is a quarter of the guide wavelength. However, this distance is chosen to be three quarter of the guide wavelength in all the presented antennas due to limitations in the present manufacturing processes. The slot antenna presented in FIG. 16 has the following dimensions: $L_{ground}$=8 mm, $W_{ground}$=5.6 mm, W=3.6 mm, $L_{SIW}$=3.975 mm, $W_{SIW}$=1.5 mm, $L_{trans}$=1.58 mm, $W_{trans}$=1.42 mm, $W_{wire}$=100 μm, $L_{slot}$=1.44 mm, $D_{end}$=1.605 mm, $D_{copper}$=0.8 μm, and $D_{polyimide}$=76 μm. The width and offset from the centerline of the slot are 70 μm and −85 μm, respectively. The width of the 50Ω microstrip is 187 μm.

With SIW-based longitudinal slot array antenna, higher directivity can be achieved. As shown in FIG. 17, all the slots are equal in length and offset from the centerline. As for the single slot antenna, the slot length and offset determine the resonance frequency and impedance matching, respectively. The spacing between each two neighboring slots is half of the guide wavelength. Improved radiation performance including higher directivity and lower side lobe level can be realized by using more slots or varying the slot length, offset and spacing. The dimensions for the longitudinal slot array antenna of FIG. 17 are: $L_{ground}$=12.5 mm, $W_{ground}$=5.6 mm, W=3.6 mm, $L_{SIW}$=8.625 mm, $W_{SIW}$=1.5 mm, $L_{trans}$=1.58 mm, $W_{trans}$=1.42 mm, $W_{wire}$=100 μm, $L_{slot}$=1.25 mm, $D_{end}$=1.7 mm, D=1.55 mm, $D_{copper}$=0.8 μm, and $D_{polyimide}$=76 μm. The width and offset from the centerline of all the slots are 70 μm and ±50 μm, respectively. The width of the 50Ω microstrip is 187 μm.

Figure 18:
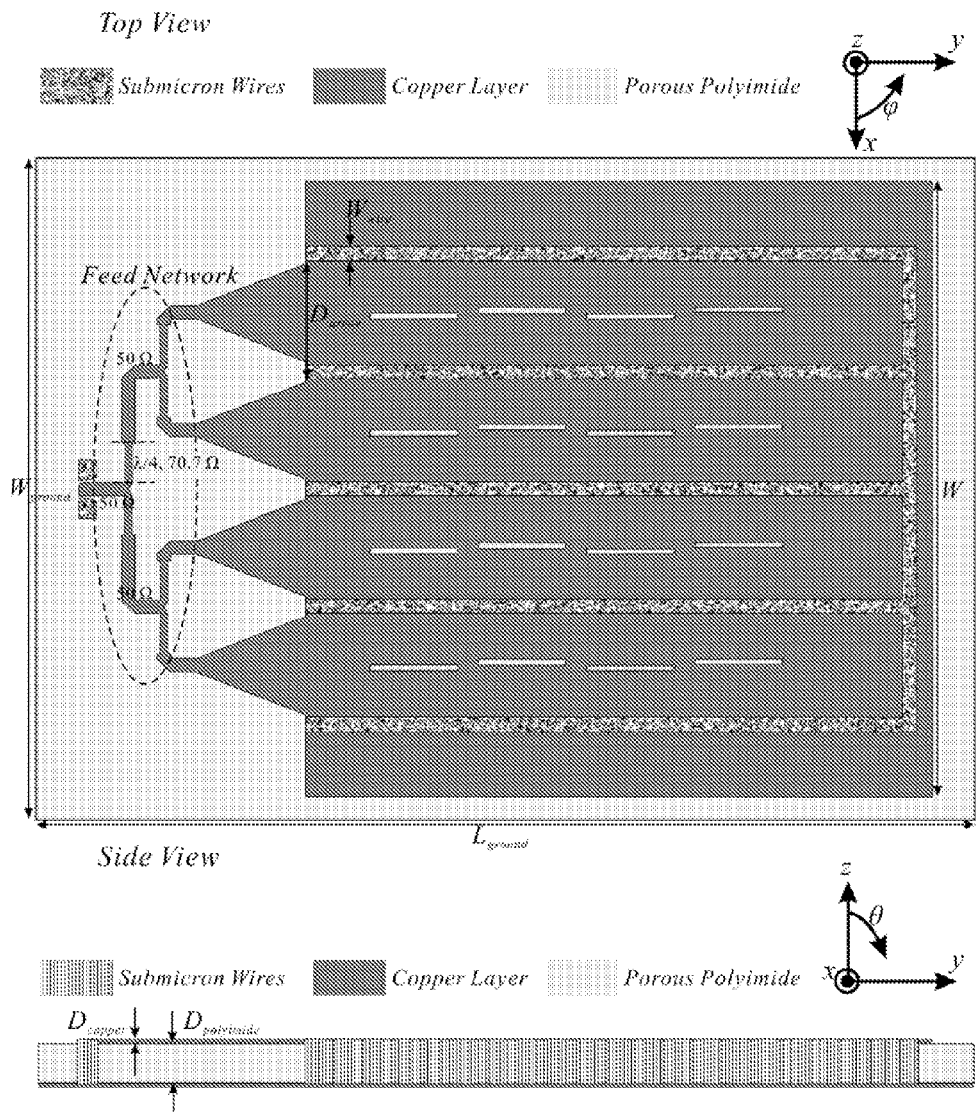
FIG. 18 is a schematic illustration of the SIW-based four-by-four slot array antenna.

SIW-based four-by-four slot array antenna, shown in FIG. 18, consists of four identical longitudinal slot array antennas which are identical to the one shown in FIG. 17. In order to achieve maximum directivity, the linear arrays are uniformly excited through a feed network. The feed network consists of three identical 3 dB power splitters. As shown in FIG. 18, each power splitter consists of a T-junction, in which the 50Ω microstrip line is connected to two identical branch lines. Dimensions of each longitudinal slot array are identical to those shown in FIG. 17 except for the overall width W=8.9 mm and the metallic wall thickness $W_{wire}$=200 μm. The distance between each two neighboring rows is $D_{array}$=1.7 mm. The width of the 50Ω microstrip is 187 μm, and the length and width of the branch lines (λ/4, 70.7Ω) in the power splitters are 600 μm and 100 μm, respectively. The length and width of the ground plane are $L_{ground}$=14 mm and $W_{ground}$=10.9 mm, respectively.

Figure 19:
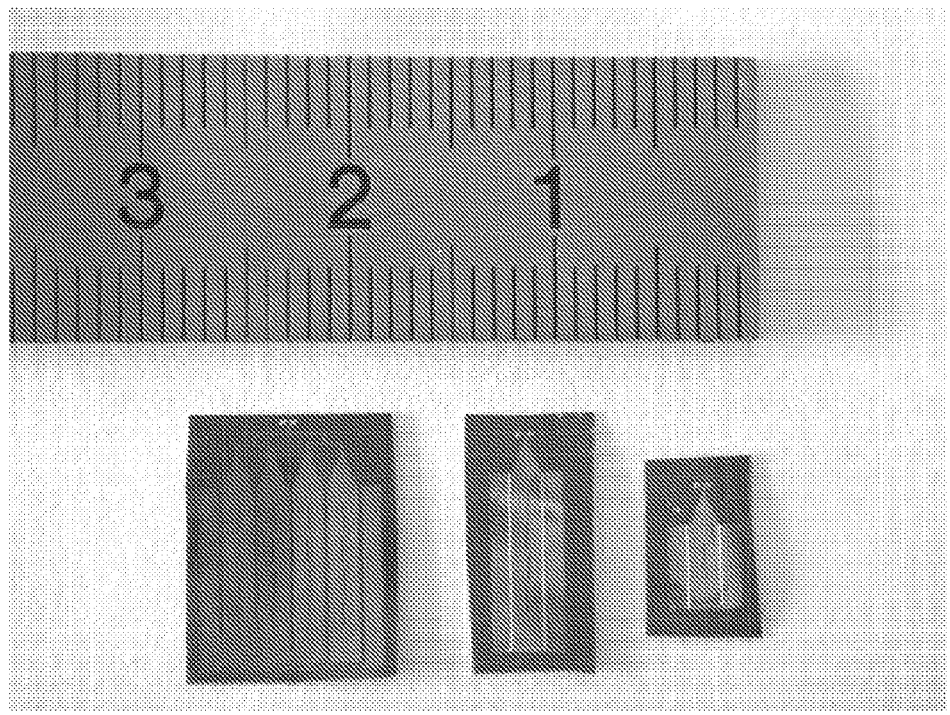
FIG. 19 is a photograph of the SIW-based slot antennas schematically illustrated in FIGS. 16-18.

Photographs of the antenna prototypes and a folded four-by-four slot array antenna are shown in FIGS. 19 and 20. As is seen in FIG. 7, the SIW of the invention and any devices manufactured therefrom, such as an antenna, can be made highly flexible and bendable and still remain fully functional. They can therefore also be used in applications requiring non-flat SIWs and SIW-based devices.

Numerical and Experimental Results

Numerical simulations of all prototypes are performed using Ansoft HFSS. Considering the high packing density and the dimensions of submicron wires, the lateral walls and ground vias are modeled as solid metallic structures in the simulations. All the presented SIWs and antennas are simulated and measured with finite ground planes, as described in FIGS. 15-18. Simulations of all the antennas on infinitely large ground planes are also performed to investigate the finite ground plane influence. Port impedance and radiation characteristics are measured to verify the numerical results.

Port Impedance

Reflection and transmission coefficient measurements are performed using a network analyzer (Agilent Technologies E8364B, PNA series) and millimeter wave VNA extenders from OML INC (V10VNA 2-T/R and V10VNA 2-T). Two ground-signal-ground (GSG) Picoprobes @ Model 110H with a pitch distance of 150 μm are used to feed the SIWs and antennas. Prior to all measurements, a one-path two-port calibration is performed with a calibration substrate (GGB CS-5).

Figure 21:
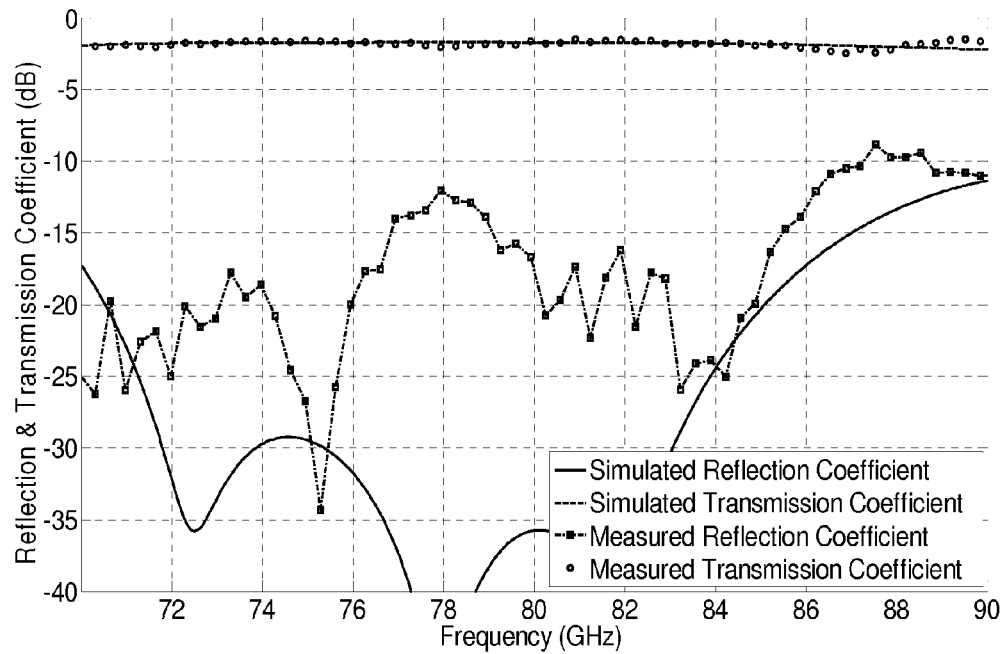
FIG. 21 illustrates simulated and measured reflection and transmission coefficients of the 3.1 mm long SIW connected to a microstrip-to-SIW transition at each end.
Figure 22:
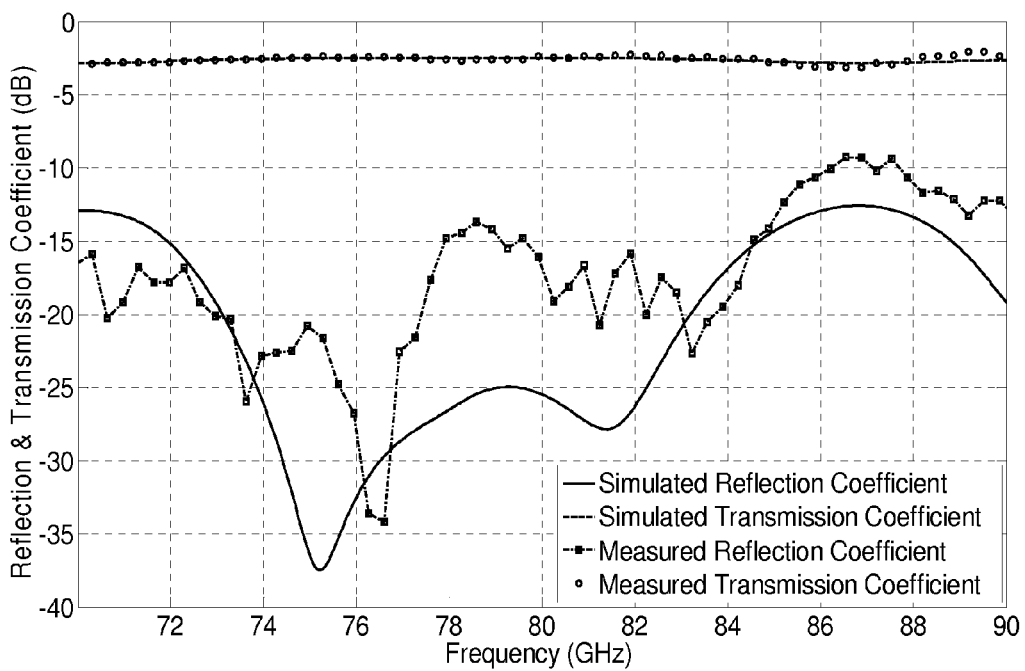
FIG. 22 illustrates simulated and measured reflection and transmission coefficients of the 6.1 mm long SIW connected to a microstrip-to-SIW transition at each end.

The attenuation per unit length of such SIWs has already been characterized from 70 up to 90 GHz in the experimental setting presented previously herein. In order to compare with the previous results, SIWs with two different lengths (3.1 mm and 6.1 mm) are fabricated and characterized. Simulated and measured reflection and transmission coefficients of those SIWs are presented in FIGS. 21 and 22. Good impedance matching is achieved from 70 up to 90 GHz in both cases. The overall insertion losses are roughly 1.9 dB and 2.8 dB at 79 GHz, respectively. In experiment, the attenuation per unit length of the SIW is found to be 0.3 dB/mm, which agrees with experimental results previously presented herein. This implies an insertion loss of each microstrip-to-SIW transition of approximately 0.4 dB. It corresponds to an insertion loss of 0.1 dB for the grounding vias at each port.

The attenuation due to the dielectric and the parallel copper layers is calculated as 0.2 dB/mm and 0.06 dB/mm, respectively. Since the latter is comparable to the measurement errors in this frequency range, the conductor and leakage losses of the submicron wires can not be accurately estimated. However, as indicated by the calculated and measured results, the dielectric loss is dominant in the presented SIWs.

Figure 23:
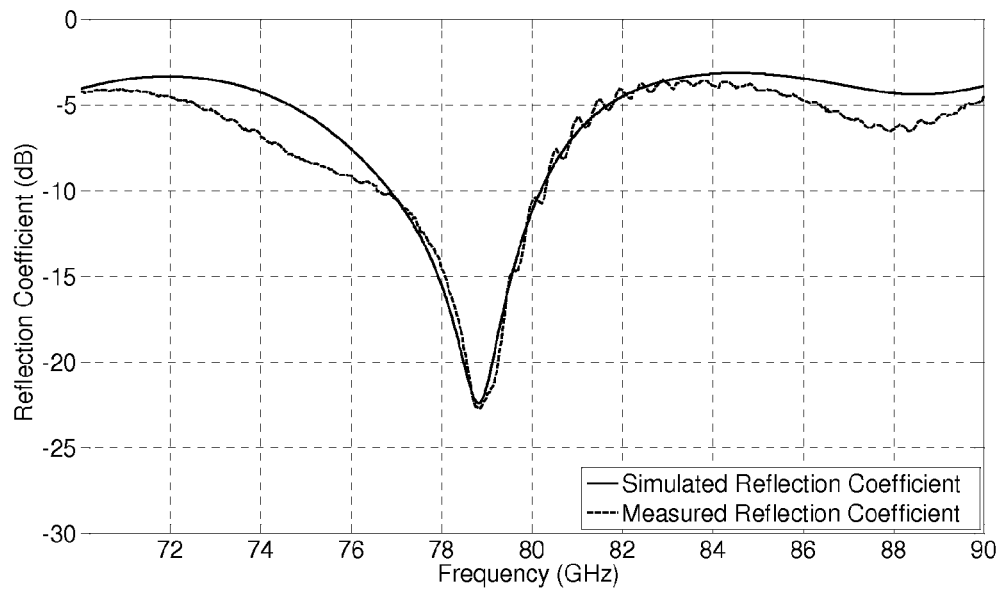
FIG. 23 illustrates simulated and measured reflection coefficients of the SIW-based single slot antenna.
Figure 24:
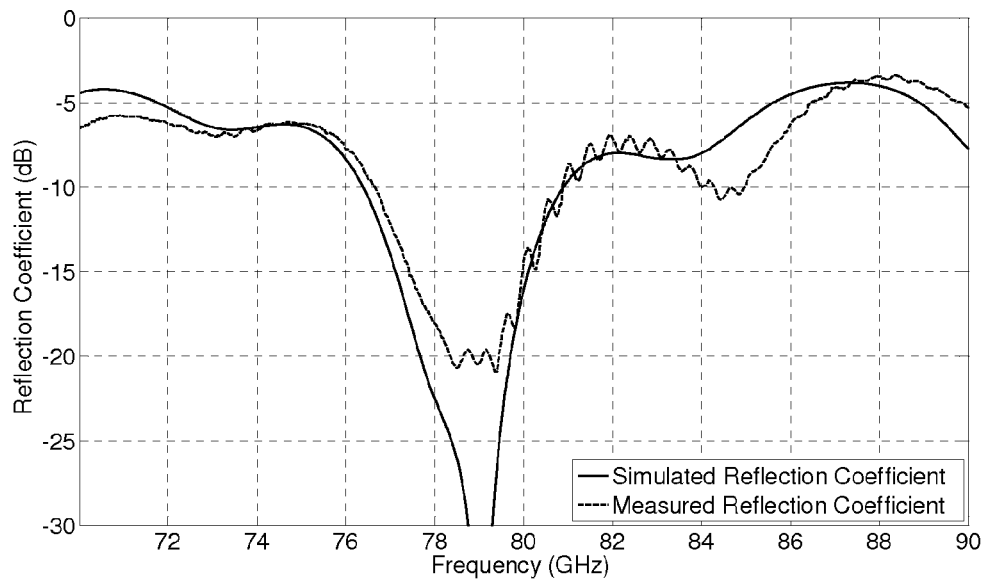
FIG. 24 illustrates simulated and measured reflection coefficients of the SIW-based longitudinal slot array antenna.
Figure 25:
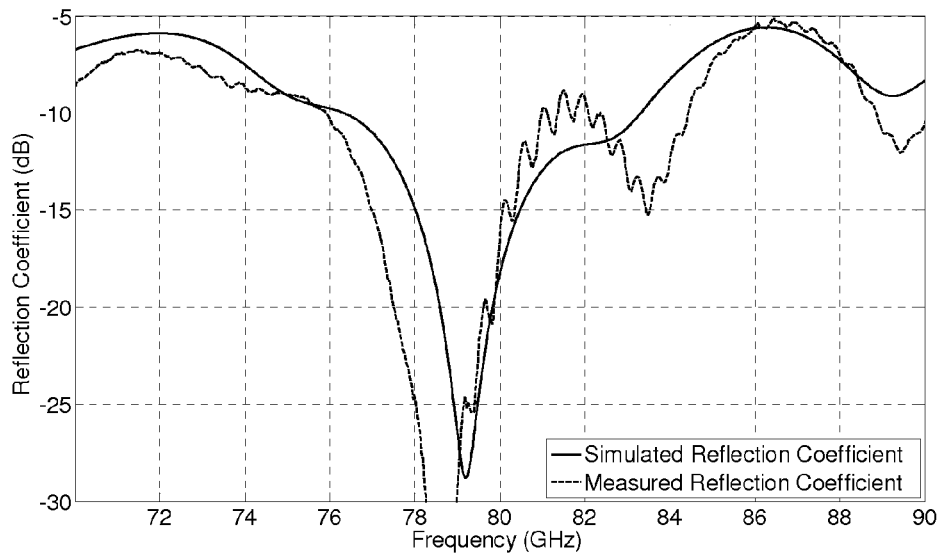
FIG. 25 illustrates simulated and measured reflection coefficients of the SIW-based four-by-four slot array antenna.

Simulated and measured port impedance of the antennas is shown in FIGS. 23 to 25. Measured results indicate that the antennas achieve about 4.7%, 5.4% and 10.7% impedance bandwidth ($S_{11}$=−10 dB) around 79 GHz, respectively. Fast ripples can be seen in the measured results, as is to be expected in such high frequency measurements.

Radiation Characteristics

Figure 26:
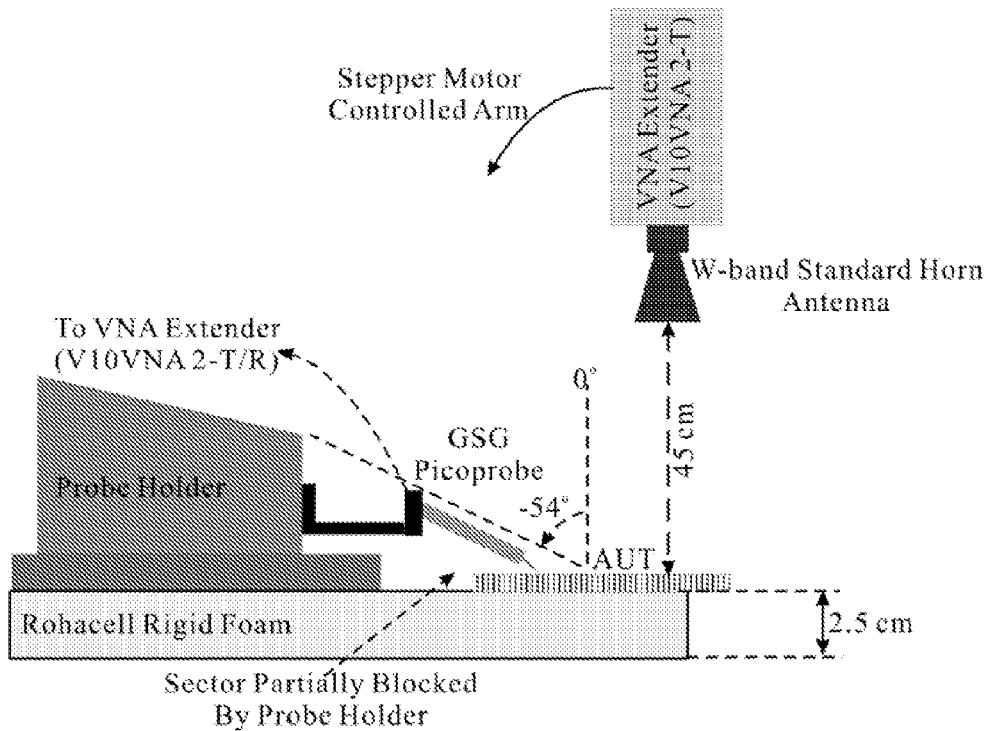
FIG. 26 illustrates measurement setup of antenna radiation properties.

Radiation properties of the proposed antennas are characterized using the measurement setup illustrated in FIG. 26.

Figure 27:
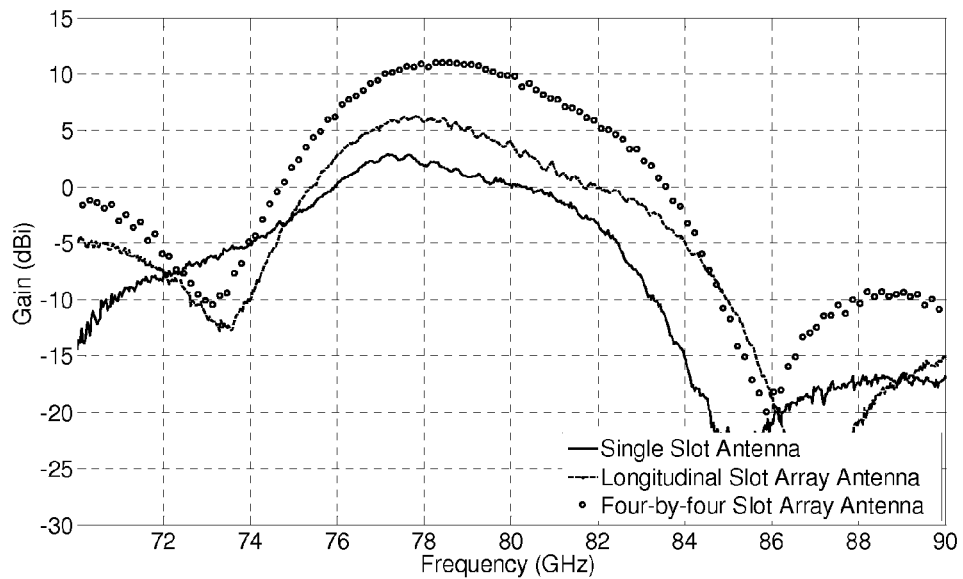
FIG. 27 illustrates measured gain versus frequency along +z-axis of the SIW-based single slot antenna, SIW-based longitudinal slot array antenna and SIW-based four-by-four slot array antenna.
Figure 28:
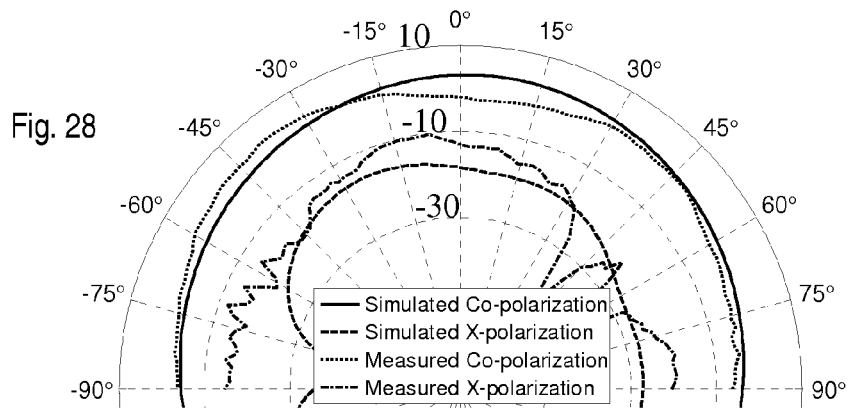
FIG. 28 illustrates simulated and measured radiation patterns of the SIW-based single slot antenna in the xz-plane.

Measured gain of the three antennas along +z-axis from 70 to 90 GHz is presented in FIG. 27. The corresponding coordinate systems can be found in FIGS. 16-18, respectively.

Figure 29:
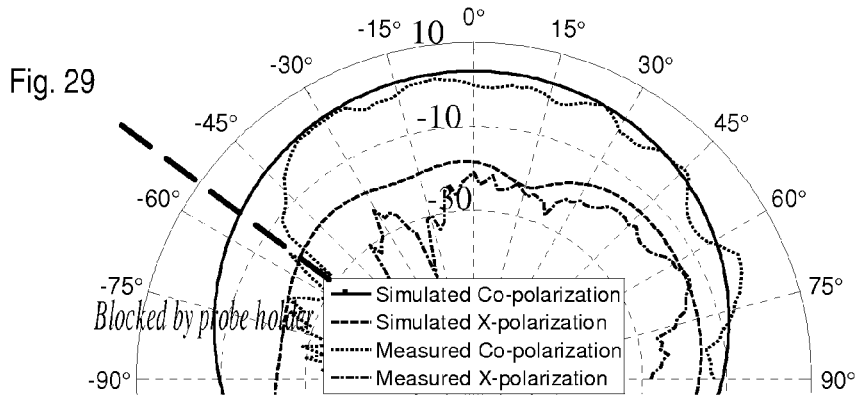
FIG. 29 illustrates simulated and measured radiation patterns of the SIW-based single slot antenna in the yz-plane.
Figure 30:
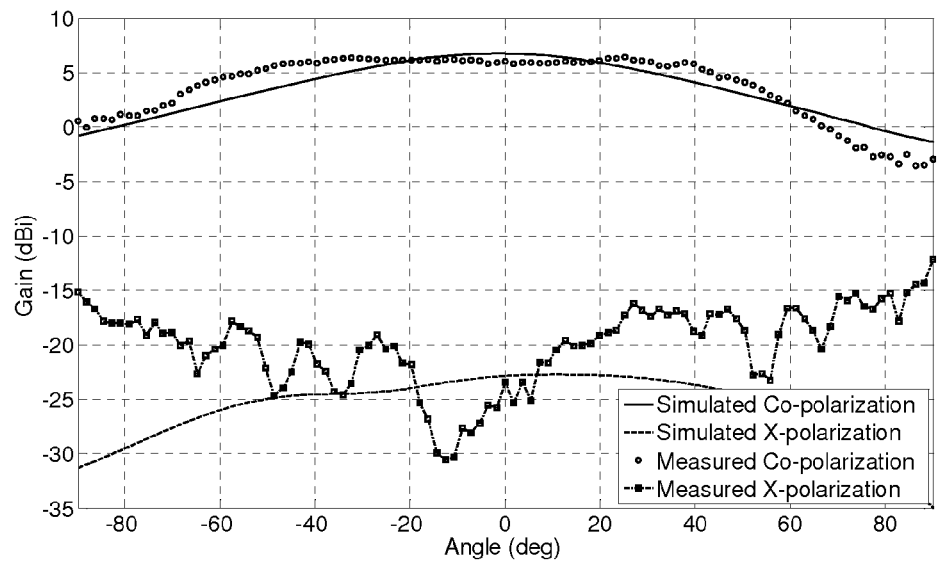
FIG. 30 illustrates simulated and measured radiation patterns of the SIW-based longitudinal slot array antenna in the xz-plane.
Figure 31:
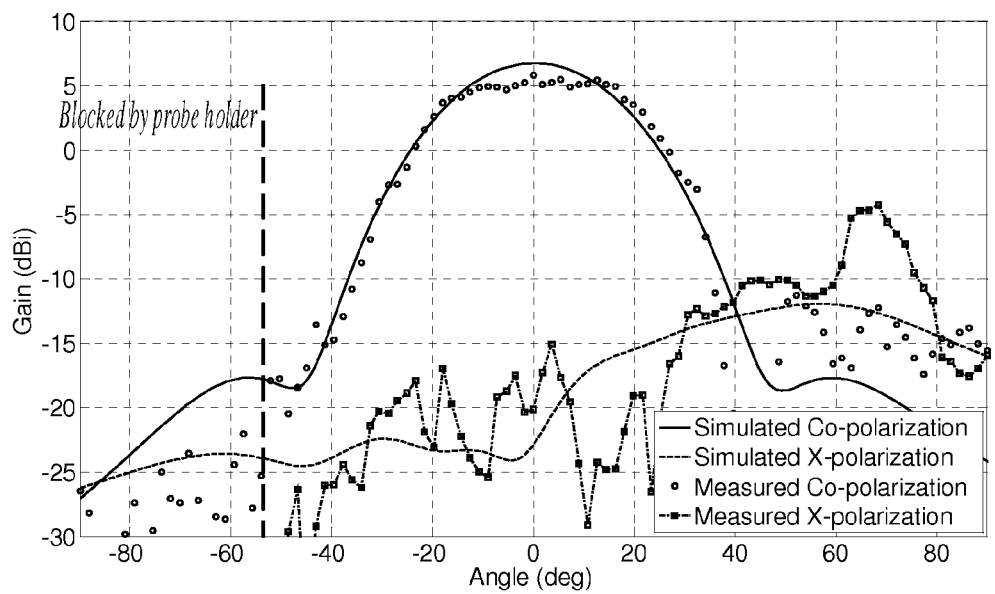
FIG. 31 illustrates simulated and measured radiation patterns of the SIW-based longitudinal slot array antenna in the yz-plane.
Figure 32:
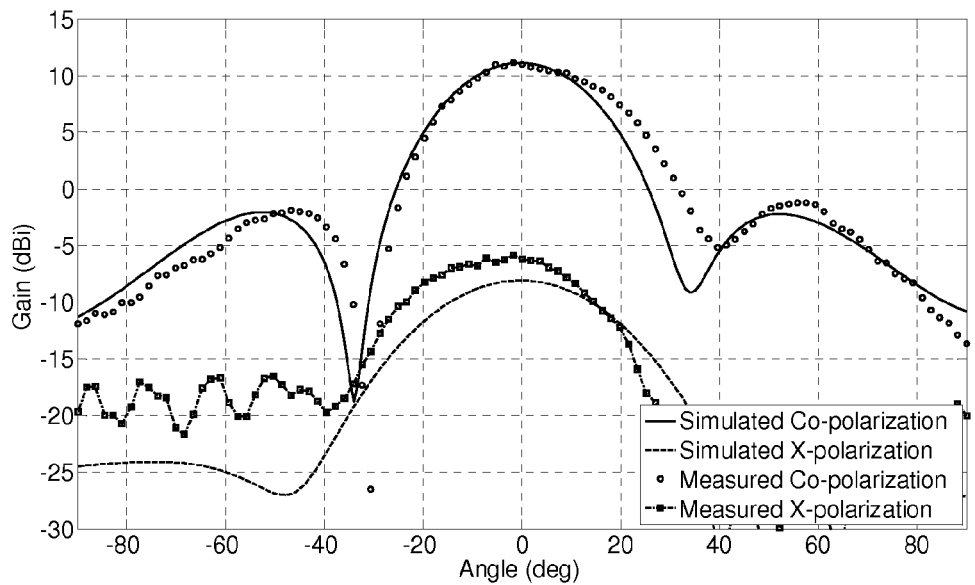
FIG. 32 illustrates simulated and measured radiation patterns of the SIW-based four-by-four slot array antenna in the xz-plane.
Figure 33:
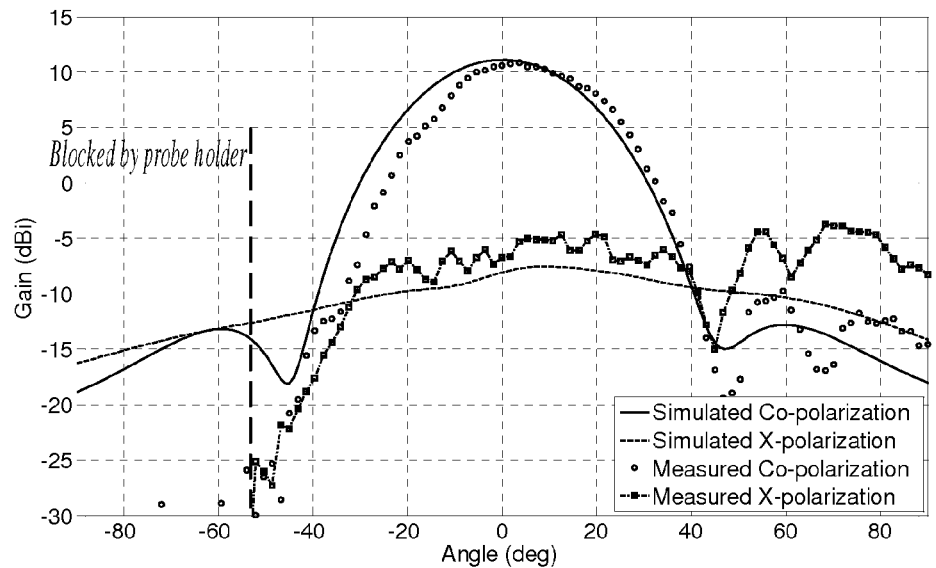
FIG. 33 illustrates simulated and measured radiation patterns of the SIW-based four-by-four slot array antenna in the yz-plane.

Simulated and measured xz- and yz-plane radiation patterns are shown in FIGS. 28-33, according to the coordinate systems in FIGS. 16-18. The SIW-based single slot, longitudinal and four-by-four slot array antennas achieve a gain of 2.8 dBi, 6.0 dBi and 11.0 dBi, respectively. Ripples can be found in the measurements which can be explained by reflections from the probe holder. As seen in FIGS. 29, 31, 33, the measured radiation patterns in the yz-plane are slightly asymmetrical. Due to blockage and reflections from the probe holder, radiation is partially blocked within the range of −90° to −54°, and side lobe levels are increased on the opposite side.

The feed network for the four-by-four slot array antenna is numerically analyzed to ensure a uniform excitation of the linear arrays. Simulated results show that the return loss is better than 19 dB, and the variations on the magnitude and phase of the transmission coefficients are less than 0.3 dB and 1°, respectively.

Besides port impedance and radiation patterns, the antenna radiation efficiency, the directivity, and the finite ground plane influence are numerically analyzed. As shown in Table 3, the SIW-based single slot, longitudinal and four-by-four slot array antennas achieve radiation efficiency of 47%, 43% and 38%, respectively. Significant increase of the antenna radiation efficiency can be found when the dielectric loss is excluded. According to the simulations, the presented antennas have a directivity of 6.8 dBi, 10.2 dBi and 15.6 dBi, respectively. The simulated antenna gains with infinite ground planes slightly differ from the ones with finite ground planes. These variations are insignificant, particularly, if the measurement errors at this frequency band are taken into account.

TABLE 3

Antenna radiation characteristics

| Antenna | Radiation efficiency | Radiation efficiency excluding dielectric loss | Directivity | Antenna gain with an infinite group plane |
|---|---|---|---|---|
| Single slot | 47% | 80% | 6.8 dBi | 2.3 dBi |
| Longitudinal slot array | 43% | 80% | 10.2 dBi | 5.8 dBi |
| Four-by-four slot array | 38% | 78% | 15.6 dBi | 11.1 dBi |

Conclusions

The SIW-based single slot, longitudinal and four-by-four slot array antennas in a flexible PCB are successfully demonstrated at 79 GHz. Good agreement between numerical simulations and measured results can been seen. It is shown that the proposed antennas achieve sufficient impedance bandwidth, and favorable radiation characteristics around 79 GHz.

The described technique enables a significant increase in the operation frequency of SIWs as well as SIW-based components. As indicated by the theoretical and experimental results, the dielectric loss is dominant in the presented SIW-based structures. In principle, better antenna performance or higher operation frequencies can be achieved by using lower loss dielectric. Furthermore, by transferring the fabrication process to thicker flexible PCB substrates, the electrical performance of the SIWs and SIW-based components can be improved. In this case, pretreatment is preferably performed at an irradiation facility with more energetic ions. However, it should be noted that the mechanical flexibility of the substrate will decrease with increasing thickness.

Thanks to low losses, high isolation, compact size, ease of integration, and low manufacturing cost, the demonstrated concept is regarded as an appropriate solution for antennas and RF circuits in advanced millimeter wave systems and applications.

While the foregoing written description of the invention enables one of ordinary skill to make and use what is considered presently to be the best mode thereof, those of ordinary skill will understand and appreciate the existence of variations, combinations, and equivalents of the specific embodiment, method, and examples herein. The invention should therefore not be limited by the above described embodiment, method, and examples, but by all embodiments and methods within the scope and spirit of the invention.

REFERENCES

1. I. Llamas-Garro and A. Corona-Chavez "Micromachined transmission lines for millimeter-wave applications" 16th IEEE International Conference on Electronics, Communications and Computers, Puebla, Mexico pp. 15-20, 2006.
2. H. Uchimura and T. Takenoshita, "Development of a laminated waveguide" IEEE Transactions on Microwave Theory and Techniques, vol. MTT-46, pp. 2438-2443, 1998.
3. D. Deslandes and K. Wu "Integrated microstrip and rectangular waveguide in planar form" IEEE Microwave and Wireless Components Letters vol. 11, no. 2, pp. 68-70, 2001
4. Y. Cheng, W. Hong, and K. Wu, "Half mode substrate integrated waveguide (HMSIW) directional filter", IEEE Microwave and Wireless Components Letters, vol. 17, no 7, pp. 504-506, 2007.
5. W. D'Orazio and K. Wu, "Substrate-integrated-waveguide circulators suitable for millimeter-wave integration" IEEE Transactions on Microwave Theory and Techniques, vol. 54, no. 10, pp. 3675-3680, 2006.
6. Z.-C. Hao, W. Hong, X.-P. Chen, J.-X. Chen, and K. Wu "A single-layer folded Substrate Integrated Waveguide (SIW) filter" Proceedings Asia-Pacific Microwave Conference p. 1606279, 2005.
7. K. K. Samanta, D. Stephens, and I. D. Robertson "60 GHz multi-chip-module receiver with substrate integrated waveguide antenna and filter" Electronics Letters vol. 42, no. 12, pp. 701-702, 2006.
8. D. Stephens, P. R. Young, and I. D. Robertson "Design and characterization of 180 GHz filters in photoimageable thick-film technology" IEEE MTT-S International Microwave Symposium Digest pp. 451-454, 2005.
9. L. Yan, W. Hong, G. Hua, J. Chen, K. Wu, and T. J. Cui, "Simulation and experiment on SIW slot array antennas," IEEE Microwave and Wireless Components Letters., vol. 14, no. 9, pp. 446-448, 2004.
10. W. Hong, B. Liu, G. Q. Luo, Q. H. Lai, J. F. Xu, Z. C. Hao, F. F. He, and X. X. Yin, "Integrated microwave and millimeter wave antennas based on SIW and HMSIW technology" Proceedings IEEE International Workshop on Antenna Technology: Small and Smart Antennas Metamaterials and Applications (iWAT07), pp. 69-72, 2007.
11. R. Spohr, "Ion Tracks and Microtechnology. Basic Principles and Applications" (Wiesbaden: Vieweg & Sohn Verlag), pp. 173-182 1990.
12. P. Apel, "Track etching technique in membrane technology" Radiat Meas, vol. 34, no. 1-6, pp. 559-566, 2001.
13. C. Trautmann, W. Bruechle, R. Spohr, J. Vetter, and N. Angert, "Pore geometry of etched ion tracks in polyimide" Nuc Instr Meth B, vol. 111 no. 1-2, pp. 70-74 1996.

14. L. Klintberg, M. Lindeberg, and G. Thornell, "Sodium hypochlorite as a developer for heavy ion tracks in polyimide" Nuc Instr Meth B, vol. 184, no. 4, pp 536-543, 2001.
15. A summary of the properties of Kapton®: www2.dupont.com/Kapton/en_US/assets/downloads/pdf/summaryofprop.pdf.
16. B. Kim, J. Lee, K. Kwang and M. Song, "PCB substrate integrated waveguide-filter using via fences at millimeter-wave" IEEE MTT-S International Microwave Symposium Digest, vol. 2, pp. 1097-1100, 2004
17. WO 2004/098256 A1

The invention claimed is:

1. A substrate integrated waveguide comprising:
a top conductive layer;
a bottom conductive layer;
a supportive substrate; and
at least one wall of conductive material connected to said top conductive layer and said bottom conductive layer, wherein said at least one wall comprises a multitude of conductive wires arranged close to each other at a density of at least $10^4$ wires/cm$^2$ and said multitude of conductive wires have an average diameter less than 10 μm.

2. The waveguide according to claim 1, wherein said density is at least $10^6$ wires/cm$^2$.

3. The waveguide according to claim 1, wherein said density is equal to or less than $10^{12}$ wires/cm$^2$.

4. The waveguide according to claim 1, wherein said density is from $10^7$ to $10^{10}$ wires/cm$^2$.

5. The waveguide according to claim 4, wherein said density is from $10^7$ to $10^9$ wires/cm$^2$.

6. The waveguide according to claim 1, wherein said top conductive layer is provided on a first side of said supportive substrate, said bottom conductive layer is provided on a second, opposite side of said supportive substrate and said multitude of conductive wires forming said at least one wall traverse through said supportive substrate and have respective first ends electrically connected to said top conductive layer and respective second, opposite ends electrically connected to said bottom conductive layer.

7. The waveguide according to claim 1, wherein said supportive substrate has a thickness of less than 500 μm.

8. The waveguide according to claim 1, wherein said top conductive layer and said bottom conductive layer have a respective thickness equal to or less than 20 μm.

9. The waveguide according to claim 1, wherein said multitude of conductive wires have an average diameter less than 5 μm.

10. The waveguide according to claim 9, wherein said multitude of conductive wires have an average diameter from 0.02 μm to 5 μm.

11. The waveguide according to claim 10, wherein said multitude of conductive wires have an average diameter from 0.2 μm to 3 μm.

12. The waveguide according to claim 1, wherein said top conductive layer and said bottom conductive layer independently comprise a conductive metal selected from copper, gold or silver, or a conductive alloy thereof.

13. The waveguide according to claim 1, wherein said multitude of conductive wires comprises a conductive metal selected from nickel, copper, silver or gold, or a conductive alloy thereof.

14. The waveguide according to claim 1, wherein said supportive substrate comprises a dielectric material selected from polyimide, polyethylene, polyethylene naphthalate, polyethylene terephthalate, liquid crystal polymer, polytetrafluoroethylene, perfluoroalkoxy, fluorinated ethylene propylene.

15. A method of producing the substrate integrated waveguide according to claim 1, said method comprising the steps of:
irradiating at least a selected portion of a substrate with accelerated particles to form a multitude of tracks of damaged substrate material in said substrate;
forming capillaries in said substrate along said multitude of tracks by removing said damaged material;
selectively filling at least a portion of said capillaries with a conductive material to from said multitude of conductive wires traversing said substrate, wherein said multitude of conductive wires are arranged in said substrate to form said at least one wall of said substrate integrated waveguide; and
electrically connecting respective first ends of a multitude of conductive wires with a top conductive layer provided on a first surface of said substrate and respective second, opposite ends of said multitude of conductive wires with said bottom conductive layer provided on a second, opposite surface of said substrate.

16. The method according to claim 15, wherein said forming step comprises exposing said substrate to etching to form said capillaries in said substrate along said multitude of tracks.

17. The method according to claim 15, wherein
said irradiating step comprises irradiating said at least a selected portion of said substrate with said accelerated particles to form said multitude of tracks of damaged substrate material traversing said substrate, and
said forming step comprises forming said capillaries through said substrate along said multitude of tracks by removing said damaged material.

18. The method according to claim 17, wherein said irradiating step comprises irradiating said at least selected portion of said substrate with accelerated ions having an average velocity and mass selected so that average kinetic energy of said accelerated ions is high enough that at least 80% of said accelerated ions fully penetrate through said substrate.

19. The method according to claim 15, wherein said selectively filling step comprises:
coating said first surface of said substrate with a masking layer;
removing a selected portion of said masking layer to expose said at least a portion of said capillaries; and
filling said exposed said at least a portion of said capillaries with said conductive material.

20. The method according to claim 15, wherein said electrically connecting step comprises:
providing said bottom conductive layer on said second, opposite surface of said substrate prior to selectively filling said at least a portion of said capillaries with said conductive material to allow said second, opposite ends of said formed multitude of conductive wires to become electrically connected to said bottom conductive layer during said selectively filling step; and
providing said top conductive layer on said first surface of said substrate following said selectively filling step to connect said first ends of said formed multitude of conductive wires with said top conductive layer.

21. The method according to claim 15, wherein said irradiating step comprises irradiating substantially the whole substrate with said accelerated particles to form a target porosity in said substrate by said multitude of tracks of damaged substrate material.

22. The method according to claim 15, wherein said selectively filling step comprises selectively filling said at least a portion of said capillaries with said conductive material to form said multitude of conductive wires traversing said substrate at a minimum density of at least $10^4$ wires/cm$^2$.

23. A substrate integrated waveguide comprising:
a top conductive layer;
a bottom conductive layer;
a supportive substrate; and
at least one wall of conductive material connected to said top conductive layer and said bottom conductive layer, wherein said at least one wall comprises a multitude of conductive wires arranged close to each other at a density of at least $10^4$ wires/cm$^2$ and said at least one wall consists of composite material in the form of dielectric material of said supportive substrate and conductive material of said multitude of conductive wires traversing through said supportive substrate, said conductive material constituting from 1 up to close to 100% of the volume of said composite material of said at least one wall.

* * * * *

UNITED STATES PATENT AND TRADEMARK OFFICE
CERTIFICATE OF CORRECTION

PATENT NO.        : 8,669,834 B2
APPLICATION NO.   : 12/922588
DATED             : March 11, 2014
INVENTOR(S)       : Shi Cheng et al.

Page 1 of 1

It is certified that error appears in the above-identified patent and that said Letters Patent is hereby corrected as shown below:

In the Claims

Claim 15, Column 24, Line 10, replace "from" with --form--.

Signed and Sealed this
Twenty-fourth Day of June, 2014

Michelle K. Lee
*Deputy Director of the United States Patent and Trademark Office*